（12） United States Patent
Lee et al.

(10) Patent No.: US 8,791,562 B2
(45) Date of Patent: Jul. 29, 2014

(54) STACK PACKAGE AND SEMICONDUCTOR PACKAGE INCLUDING THE SAME

(75) Inventors: Chung-sun Lee, Gunpo-si (KR);
Jung-Hwan Kim, Bucheon-si (KR);
Yun-hyeok Im, Yongin-si (KR); Ji-hwan Hwang, Asan-si (KR); Hyon-chol Kim, Hwaseong-si (KR); Kwang-chul Choi, Suwon-si (KR); Eun-kyoung Choi, Bucheon-si (KR); Tae-hong Min, Gumi-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 255 days.

(21) Appl. No.: 13/183,645

(22) Filed: Jul. 15, 2011

(65) Prior Publication Data

US 2012/0018871 A1   Jan. 26, 2012

(30) Foreign Application Priority Data

Jul. 21, 2010   (KR) ........................ 10-2010-0070471

(51) Int. Cl.
*H01L 23/58*   (2006.01)
*H01L 25/065*   (2006.01)
*H01L 25/10*   (2006.01)
*H01L 23/00*   (2006.01)

(52) U.S. Cl.
CPC ....... *H01L 25/0657* (2013.01); *H01L 2225/107* (2013.01); *H01L 2924/01019* (2013.01); *H01L 2924/15311* (2013.01); *H01L 25/0655* (2013.01); *H01L 2924/09701* (2013.01); *H01L 2225/1094* (2013.01); *H01L 2224/73265* (2013.01); *H01L 2224/32225* (2013.01); *H01L 2224/48227* (2013.01); *H01L 2924/3511* (2013.01); *H01L 2224/32245* (2013.01); *H01L 2224/0557* (2013.01); *H01L 2224/16145* (2013.01); *H01L 2224/32145* (2013.01); *H01L 25/105* (2013.01); *H01L 2924/01087* (2013.01); *H01L 2224/97* (2013.01); *H01L 2224/73204* (2013.01); *H01L 2924/15331* (2013.01); *H01L 2225/1023* (2013.01); *H01L 2224/73253* (2013.01); *H01L 2225/06565* (2013.01); *H01L 2924/18161* (2013.01); *H01L 24/97* (2013.01); *H01L 2224/16225* (2013.01)
USPC ................... 257/698; 257/E23.194; 257/738; 257/E21.59; 257/774; 257/612; 438/107; 438/612; 438/108

(58) Field of Classification Search
USPC ............ 257/698, E23.194, 738, E21.59, 774, 257/48, 612; 438/107, 612, 108
See application file for complete search history.

(56) References Cited

U.S. PATENT DOCUMENTS

2012/0205800 A1*   8/2012   Shen et al. ..................... 257/737
2013/0049229 A1*   2/2013   Su ................................ 257/777
2013/0127054 A1*   5/2013   Muthukumar et al. ....... 257/738

FOREIGN PATENT DOCUMENTS

| JP | 2007-180529 | 7/2007 |
|---|---|---|
| JP | 2009-170802 | 7/2009 |
| KR | 10-2002-0035939 | 5/2002 |

* cited by examiner

*Primary Examiner* — Cathy N Lam
(74) *Attorney, Agent, or Firm* — Stanzione & Kim, LLP

(57) ABSTRACT

A stack package usable in a three-dimensional (3D) system-in-package (SIP) includes a first semiconductor chip, a second semiconductor chip, and a supporter. The first semiconductor chip includes a through silicon via (TSV), and the second semiconductor chip is stacked on the first semiconductor chip and is electrically connected to the first semiconductor chip through the TSV of the first semiconductor chip. The supporter is attached onto the first semiconductor chip so as to be spaced apart from an edge of the second semiconductor chip.

17 Claims, 25 Drawing Sheets

STACK PACKAGE AND SEMICONDUCTOR PACKAGE INCLUDING THE SAME

CROSS-REFERENCE TO RELATED APPLICATIONS

This application claims priority under 35 U.S.C. §119 from Korean Patent Application No. 10-2010-0070471, filed on Jul. 21, 2010, in the Korean Intellectual Property Office, the disclosure of which is incorporated herein in its entirety by reference.

BACKGROUND OF THE INVENTION

1. Field of the Invention

The inventive concept relates to a stack package, and a semiconductor package including the stack package, and more particularly, to a stack package including a supporter attached onto a first semiconductor chip on which a second semiconductor chip is stacked, and a semiconductor package including the stack package.

2. Description of the Related Art

Along with the developments of high-speed and highly-integrated semiconductor devices, methods to connect semiconductor chips in a semiconductor package have been developed. Such methods include a conventional wire bonding method, a package-on-package (PoP) method, and a system-in-package (SIP) method in which semiconductor chips are directly connected to each other through micro bumps. Specifically, as the number of input/output pins has remarkably increased along with the developments of highly-integrated semiconductor devices, technologies to connect semiconductor chips by using a through silicon via (TSV) with fine pitches have been widely developed, and a semiconductor stack structure has been applied to a general-purpose field by using these technologies.

In semiconductor chip stack technologies, thin semiconductor chips are stacked on one another. However, since the rigidity of silicon (Si) is weak, warpage may be seriously caused due to a difference in the coefficients of thermal expansion (CTE) of a semiconductor chip and a molding member.

SUMMARY OF THE INVENTION

The inventive concept provides a stack package including a supporter to prevent warpage, the supporter being fixed onto a first semiconductor chip on which a second semiconductor chip is stacked.

The inventive concept also provides a semiconductor package including the stack package.

Additional utilities and advantages of the present general inventive concept will be set forth in part in the description which follows and, in part, will be obvious from the description, or may be learned by practice of the general inventive concept According to the utilities and advantages of the inventive concept, there is provided a stack package including a first semiconductor chip including a through silicon via (TSV), a second semiconductor chip that is stacked on the first semiconductor chip and is electrically connected to the first semiconductor chip through the TSV of the first semiconductor chip, and a supporter that is attached onto the first semiconductor chip so as to be spaced apart from an edge of the second semiconductor chip.

The supporter may have a ring shape surrounding the edge of the second semiconductor chip. The supporter may include a bar-shaped portion that extends along at least a portion of a lateral surface of the second semiconductor chip, and/or a corner reinforcing portion that is bent so as to correspond to a corner of the second semiconductor chip.

The stack package may further include a molding member that covers an upper surface of the first semiconductor chip so as to seal the second semiconductor chip and the supporter. The supporter may include a material having a Young's modulus greater than a Young's modulus of the molding member and smaller than a Young's modulus of the first semiconductor chip.

An upper surface of the second semiconductor chip and an upper surface of the supporter may be disposed at the same layer level, and the molding member exposes the upper surface of the second semiconductor chip and the upper surface of the supporter. The stack package may further include a thermal interface material layer disposed on the upper surface of the second semiconductor layer; and a head spreader disposed on the thermal interface material layer. The stack package may further include a solder layer that is interposed between the supporter and the heat spreader so as to fix the supporter and the heat spreader to each other.

The first semiconductor chip may include a heat dissipation through silicon via (TSV) that is connected to the supporter so that heat is transferred between the supporter and the heat dissipation TSV. Te second semiconductor chip may include a plurality of semiconductor chips stacked on each other.

According to the utilities and advantages of the inventive concept, there is provided a semiconductor package including a first substrate, a first semiconductor chip installed on the first substrate and including a through silicon via (TSV), a second semiconductor chip that is stacked on the first semiconductor chip and is electrically connected to the first semiconductor chip through the TSV of the first semiconductor chip, a supporter that is attached onto the first semiconductor chip so as to be spaced apart from an edge of the second semiconductor chip, and an internal molding member that covers an upper surface of the first semiconductor chip so as to seal the second semiconductor chip and the supporter.

The semiconductor package may further include an external molding member that covers an upper surface of the first substrate so as to seal the first semiconductor chip and the internal molding member.

An upper surface of the second semiconductor chip and an upper surface of the supporter may be disposed at the same layer level, and the molding member may expose the upper surface of the second semiconductor chip and the upper surface of the supporter. The semiconductor package may further include a thermal interface material layer disposed on the upper surface of the second semiconductor layer; and a head spreader disposed on the thermal interface material layer. The heat spreader may include a solder layer that is formed on an entire inner surface of the heat spreader, and the heat spreader and the supporter may be fixed to each other by a portion of the solder layer disposed on the supporter.

The semiconductor package may further include a thermal interface material layer disposed on an upper surface of the second semiconductor chip and an upper surface of the supporter, a second substrate that is disposed on the thermal interface material layer so as to contact an upper surface of the thermal interface material and is electrically connected to the first substrate, and a third semiconductor chip installed on the second substrate. The first substrate may include a first substrate pad disposed on an upper surface of the first substrate, an external connection pad disposed on a lower surface of the first substrate, and a wiring pattern for connecting the first substrate pad and the external connection pad to each other, wherein the second substrate may include a second substrate heat dissipation pad disposed on a lower surface of the second substrate, a second substrate connection pad disposed on the lower surface of the second substrate, and a wiring pattern for connecting the second substrate heat dissipation pad and the second substrate connection to each other, wherein the second substrate heat dissipation pad may be disposed on the supporter so that heat is transferred between the second substrate heat dissipation pad and the supporter by the thermal interface material layer, and wherein the first substrate pad of the first substrate and the second substrate connection pad of the second substrate may be connected to each other so that heat is transferred between the first substrate pad and the second substrate connection pad by a heat dissipation bump.

According to utilities and advantages of the inventive concept, there is provided a stack package including a first semiconductor chip including a through silicon via (TSV), a second semiconductor chip that is stacked on the first semiconductor chip and is electrically connected to the first semiconductor chip through the TSV of the first semiconductor chip, a supporter that is fixed onto the first semiconductor chip so as not to overlap the second semiconductor chip, and a molding member that covers an upper surface of the first semiconductor chip so as to seal the second semiconductor chip and the supporter, and includes a material having a Young's modulus smaller than a Young's modulus of the supporter.

According to utilities and advantages of the inventive concept, there is provided a method of manufacturing a stack package. A wafer including a plurality of first semiconductor chips each including a TSV is prepared. Then, a plurality of second semiconductor chips are stacked on the first semiconductor chips so as to be electrically connected to the first semiconductor chips through the TSV. Then, a plurality of supporters are attached onto the first semiconductor chips so as to be spaced apart from an edge of each second semiconductor chip. Then, a molding member is formed on the wafer so as to cover the second semiconductor chips and the supporter. Then, an upper portion of the molding member and an upper portion of the second semiconductor chip are removed so as to expose upper surfaces of the supporters. Then, the first semiconductor chips are separated.

According to utilities and advantages of the inventive concept, there is provided a stack package including a first semiconductor chip, a second semiconductor chip disposed on a first area of the first semiconductor chip and electrically connected to the first semiconductor chip, and a supporter disposed on a second area of the first semiconductor chip to protect the first semiconductor chip.

The second area may surround a plurality of portions of the first area.

The first area and the second area may not overlap.

The first area may be spaced apart from the second area by a distance shorter than a height or width of the supporter.

The second semiconductor may include a memory unit to store and read data, and the first semiconductor may include a circuit device to process the read data and the data to be stored in the memory unit.

The first semiconductor chip may include a through silicon via (TSV) formed therein to provide an electrical communication between a first side on which the second semiconductor chip is disposed and a second side on which a bump is formed to provide another communication between an external device and at least one of the first semiconductor chip and the second semiconductor chip through the TSV.

The first semiconductor chip may further include a first through silicon via (TSV) formed in the first area and formed of an conductive material to electrically connect the first semiconductor chip and the second semiconductor chip, and a second through silicon via (TSV) formed in the second area and formed of a heat dissipating material to thermally connect the supporter and an outside thereof.

The supporter may not be electrically connected to the first semiconductor and the second semiconductor.

The supporter may protrude in a direction perpendicular to the second area.

The stack package may further include a molding member to cover at least a portion of the supporter, the first semiconductor chip, and the second semiconductor chip, and the supporter may be spaced apart from a lateral surface of the second semiconductor chip by a first distance, spaced apart from an external surface of the molding member by a second distance, and have a width wider than at least one of the first distance and the second distance.

The supporter may be disposed symmetrically with respect to a central portion of the first semiconductor chip.

The supporter may be disposed asymmetrically with respect to a central portion of the first semiconductor chip.

The supporter may have a height from the first semiconductor chip to correspond to a height of the second semiconductor chip from the first semiconductor chip.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
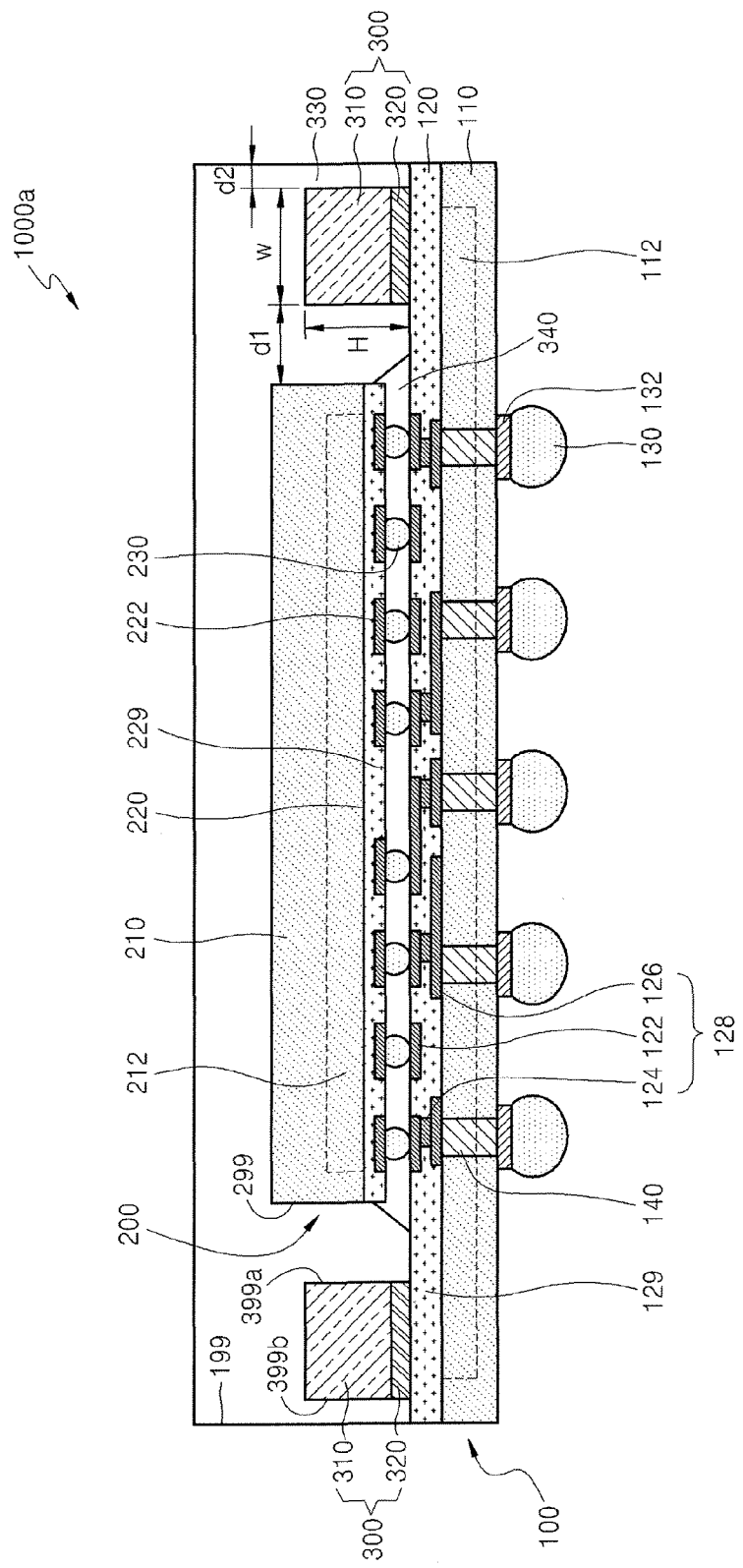
FIG. 1 is a cross-sectional view of a stack package according to an embodiment of the inventive concept.

Hereinafter, a stack package, a semiconductor package, and a method of manufacturing the semiconductor package will be described with regard to exemplary embodiments of the inventive concept with reference to the attached drawings. It will be understood that various changes in form and details may be made, and thus, exemplary embodiments will be illustrated in diagrams, and will be described with reference to the diagrams.

Reference will now be made in detail to example embodiments, examples of which are illustrated in the accompanying drawings. However, the inventive concept is not limited to the embodiments described hereinafter, and the embodiments herein are rather introduced to provide easy and complete understanding of the scope and spirit of the inventive concept.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third etc. may be used herein to describe various elements, members, components, regions, layers and/or sections, these elements, members, components, regions, layers and/or sections should not be limited by these terms. These terms are only used to distinguish one element, member, component, region, layer or section from another region, layer or section. Thus, a first element, member, component, region, layer or section discussed below could be termed a second element, member, component, region, layer or section without departing from the teachings of the inventive concept.

Unless the context clearly indicates otherwise, all terminologies used herein, including technological and scientific terminologies used herein have the same meaning as terminologies that are understood by one of ordinary skill in the art to which the inventive concept pertains. It will be understood that general terminologies that are defined in dictionaries have contextual meaning in the art, and do not have ideally and excessively formal meaning, unless the context clearly indicates otherwise.

It will also be understood that when a layer is referred to as being "on" another layer or substrate, it can be directly on the other layer or substrate, or intervening layers may also be present. In the drawings, the thicknesses of layers and regions are exaggerated for clarity. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

FIG. 1 is a cross-sectional view of a stack package 1000a according to an embodiment of the inventive concept.

Referring to FIG. 1, the stack package 1000a includes a first semiconductor chip 100, a second semiconductor chip 200, and a supporter 310. Through silicon vias (TSVs) 140 are formed in the first semiconductor chip 100. The TSVs 140 are form with a conductive material filled or disposed in corresponding holes formed in the first semiconductor chip 100. The second semiconductor chip 200 is disposed on the first semiconductor chip 100, and is electrically connected to the first semiconductor chip 100 through the TSVs 140 of the first semiconductor chip 100. The supporter 310 is spaced apart from an edge of the second semiconductor chip 200, and is attached onto the first semiconductor chip 100.

The first semiconductor chip 100 may include a semiconductor layer 110, a wiring layer 120, connection bumps 130, and the TSVs 140.

The semiconductor layer 110 may include a semiconductor wafer, and may include a group IV compound, or group III-V compounds. For example, the group IV compound or group III-V compounds of the semiconductor layer 110 may include silicon (Si), germanium (Ge), or gallium arsenide (GaAs). The semiconductor layer 110 may be formed by polishing a rear surface of the semiconductor wafer to a predetermined thickness.

The semiconductor layer 110 may include circuit devices 112 formed therein. The circuit devices 112 may include a memory device, a core circuit device, a peripheral circuit device, a logic circuit device, or a control circuit device. Examples of the memory device may include a volatile semiconductor memory device such as a dynamic random access memory (DRAM), and a static random access memory (SRAM), and a non-volatile semiconductor memory device such as an erasable programmable read-only memory (EPROM), an electrically erasable programmable read-only memory (EEPROM), and a flash EEPROM. In addition, the semiconductor layer 110 may include a circuit wiring or conductive line (not illustrated) to electrically connect the circuit devices 112. In addition, the semiconductor layer 110 may include a well (not shown). The semiconductor layer 110 may have a thickness of at most 60 μm due to limitations of a depth for forming each TSV 140. For example, the semiconductor layer 110 may have a thin thickness of about 50 μm.

The wiring layer 120 may be formed on a surface of the semiconductor layer 110 in which the circuit devices 112 are formed. The wiring layer 120 may include wiring patterns 128 and an insulating layer 129. Each wiring pattern 128 may include an upper wiring 122, a lower wiring 126, and a via electrode 124 connecting the upper wiring 122 and the lower wiring 126 to each other.

The upper wiring 122 may include pads to be connected to corresponding micro connection bumps 230 of the second semiconductor chip 200. The lower wiring 126 may be electrically connected to the circuit devices 112. In addition, the lower wiring 126 may be electrically connected to the TSVs 140, and may include a pad that is connected directly to the TSV 140.

The wiring pattern 128 of the wiring layer 120 may be formed of metal such as polysilicon (or polycrystalline silicon) doped with impurities, tungsten (W), or aluminum (Al). Although the wiring layer 120 is illustrated to be completely separated from the semiconductor layer 110 in FIG. 1, a portion of the wiring layer 120 may be disposed in the semiconductor layer 110.

The insulating layer 129 included in the wiring layer 120 may insulate the upper wiring 122 and the lower wiring 126 from each other, and the via electrode 124 may be formed through the insulating layer 129 in the wiring layer 120. The insulating layer 129 may be provided to protect the first semiconductor chip 100 from external moisture or shocks. The insulating layer 129 may include silicon oxide, silicon nitride, or the like, or a resin such as polyimide. The wiring layer 120 may be omitted. For example, a bump of the second semiconductor chip 200 may be directly connected to the TSV 140, or a pad (not shown) formed on the TSV 140, without the wiring layer 120.

The connection bumps 130 may be formed on a lower surface of the semiconductor layer 110. The connection bumps 130 may be provided to be connected to external devices. External connection pads 132 may be provided between the lower surface of the semiconductor layer 110 and the connection bumps 130. Each external connection pad 132 may be connected to a lower portion of the TSV 140, and may provide a surface to stably fix each connection bump 130 thereto. Although not illustrated in FIG. 1, a redistribution wiring may be formed on the lower surface of the semiconductor layer 110 to efficiently connect the TSVs 140 and connection bumps 130. In this case, the connection bumps 130 may be arranged irrespective of the arrangement of the TSVs 140. Although the number of the connection bumps 130 is five in FIG. 1, this is just an example, and the number of the connection bumps 130 may be different from five.

The TSVs 140 are formed through the semiconductor layer 110. The TSVs 140 may electrically connect the wiring patterns 128 and the connection bumps 130 to each other. The TSVs 140 may be formed of metal such as Al, copper (Cu), or W, polysilicon (or polycrystalline silicon), or silicon doped with Si. Although the number of the TSVs 140 is five in FIG. 1, this is just an example, and the number of the TSVs 140 may be different from five. The semiconductor layer 110 may be formed with through holes, and a material may be filled or disposed in the corresponding through holes to form the TSVs 140.

The first semiconductor chip 100 may have a thickness of 100 μm or less, for example, 50 μm. The first semiconductor chip 100 may have a small thickness by polishing a rear surface thereof using a grinding process. Thus, it is possible that a shape of the first semiconductor chip 100 can be deformed, changed, or bent. And it is also possible that a surface of the first semiconductor chip 100 can not be flat but curved.

When the first semiconductor chip 100 is mainly formed of Si, the coefficient of thermal expansion (CTE) of the first semiconductor chip 100 is about 3 to about 4 $\mu m \cdot m^{-1} \cdot k^{-1}$. In addition, Young's modulus for indicating the rigidity of the first semiconductor chip 100 is about 30 GPa. For reference, the CTE of Si is 2.6 $\mu m \cdot m^{-1} \cdot k^{-1}$, and the Young's modulus of Si is 185 GPa. Therefore, as described above, it is possible that the shape or the surface of the first semiconductor chip 100 can be deformed or changed rather than maintaining an original or desired shape or surface thereof.

The second semiconductor chip 200 may include a semiconductor layer 210, a wiring layer 220, and the micro connection bumps 230.

The semiconductor layer 210 may include Si, Ge, or GaAs. The semiconductor layer 210 may include circuit devices 212 formed therein. The circuit devices 212 may include a memory device, a core circuit device, a peripheral circuit device, a logic circuit device, or a control circuit device. In addition, the semiconductor layer 210 may include a circuit wiring or conductive line (not shown) to electrically connect the circuit devices 212 to each other, and may include a well (not shown). For example, a core circuit device, a peripheral circuit device, a logic circuit device, or a control circuit device may be formed in the semiconductor layer 110 of the first semiconductor chip 100, and a memory device may be formed in the semiconductor layer 210 of the second semiconductor chip 200.

The wiring layer 220 may be formed below a surface of the semiconductor layer 210 in which the circuit devices 212 are formed. The wiring layer 220 may include wiring patterns 222 and an insulating layer 229. The wiring patterns 222 may connect the circuit devices 212 to the micro connection bumps 230, and may include a pad to which the micro connection bumps 230 are to be attached. The wiring patterns 222 may be formed of polysilicon, or polycrystalline silicon, doped with impurities, W, or Al. The wiring patterns 222 are illustrated to be completely separated from the semiconductor layer 210 in FIG. 1, however, a part of the wiring patterns 222 may be disposed in the semiconductor layer 210.

The micro connection bumps 230 may be formed below the wiring patterns 222. The micro connection bumps 230 may be provided to electrically connect the second semiconductor chip 200 to the first semiconductor chip 100. Although the number of the micro connection bumps 230 is eight in FIG. 1, this is just an example, and the number of the micro connection bumps 230 may be different from eight, if necessary. In addition, although the second semiconductor chip 200 is connected onto the first semiconductor chip 100 by the micro connection bumps 230 in FIG. 1, this is just an example, and the second semiconductor chip 200 may be connected to the first semiconductor chip 100 by using other methods or structures.

The second semiconductor chip 200 may be attached to the first semiconductor chip 100 by an underfill layer 340. The underfill layer 340 may include epoxy, benzocyclobutyne, or polyimide. However, if the second semiconductor chip 200 stably adheres to the first semiconductor chip 100 by the micro connection bumps 230, the underfill layer 340 may be omitted.

The supporter 310 may be provided to prevent warpage of the stack package 1000a and to protect the first semiconductor chip 100.

The supporter 310 may be attached onto the first semiconductor chip 100 and may be spaced apart from an edge of the second semiconductor chip 200. A planar shape of the supporter 310 will be described in detail with reference to FIGS. 2A through 2F.

The supporter 310 may be attached to the first semiconductor chip 100 by an adhesive layer 320. The adhesive layer 320 may be formed of a solder paste having high heat conductivity. Alternatively, the adhesive layer 320 may be formed of an adhesive film including epoxy, polyimide, or the like. However, when a material included in the supporter 310 has adhesive properties, the adhesive layer 320 may be omitted.

The supporter 310 may be formed of a material having a Young's modulus of about 10 GPa. The supporter 310 may be formed of a material having high rigidity, which will be described in detail.

The supporter 310 may be formed of an epoxy resin having high rigidity. In this case, since an epoxy resin has adhesive properties, the supporter 310 formed of the epoxy resin may directly adhere to the first semiconductor chip 100 without the adhesive layer 320.

The supporter 310 may be formed of metal having high rigidity. In particular, the supporter 310 may be formed of Invar that is a nickel (Ni)-iron (Fe)-alloy having a low CTE. Since Invar including 64% of Fe and 36% of Ni has a low CTE of about 1.2 $\mu m \cdot m^{-1} \cdot k^{-1}$, Invar relatively barely expands with respect to a change in temperature, and has high rigidity, thereby preventing warpage of the stack package 1000a, in particular, of the first semiconductor chip 100.

According to an embodiment of the inventive concept, the stack package 1000a may further include a molding member 330 that covers an upper surface of the first semiconductor chip 100 so as to seal the second semiconductor chip 200 and the supporter 310.

The molding member 330 may prevent electrical deterioration of the stack package 1000a due to air, corrosion, foreign material, or other various reasons, and may improve the mechanical stability of the stack package 1000a. The stack package 1000a may be one component installed in a final semiconductor package. In this case, the molding member 330 does not have to have the same high rigidity as that of an epoxy molding compound (EMC) that is mainly used as a molding material of a final semiconductor package. For example, the molding member 330 may include an epoxy resin, a silicon resin, or polyimide resin. A material used in the molding member 330 may be referred to as a liquid mold, a liquid EMC, or a liquid sealant, in related industrial fields.

Young's modulus of the molding member 330 may be about 1 GPa. When the molding member 330 has a low Young's modulus of about 0.5 GPa, a minimum mechanical stability of the molding member 330 may not be guaranteed. As the Young's modulus of the molding member 330 is increased, since a stress due to a CTE difference between the molding member 330 and the first semiconductor chip 100 is further increased, and the molding member 330 may not absorb the stress, warpage of the first semiconductor chip 100 may be more serious. The CTE of the molding member 330 is about 15 to about 20 $\mu m \cdot m^{-1} \cdot k^{-1}$, which is much greater than that of the first semiconductor chip 100.

When two materials are combined, a stress caused by thermal expansion is proportional to a CTE difference between the two materials. That is, as the CTE difference between the two materials is increased, the stress is further increased. In addition, the stress is proportional to the Young's modulus and thickness of a material. As described above, since the molding member 330 needs to have a protection function, there is a limit in reducing the Young's modulus of the molding member 330. Also, there is a limit in reducing the thickness of the molding member 330 to a thickness thinner than that of the second semiconductor chip 200.

As described above, since the supporter 310 is attached or formed onto the first semiconductor chip 100, a stress due to a CTE difference may be sustained. To this end, the supporter 310 may be formed of a material having a greater Young's modulus than that of the molding member 330. If the supporter 310 has smaller rigidity than that of the molding member 330, the stress may not be sustained.

In addition, the supporter 310 may be formed of a material having a smaller Young's modulus than that of the first semiconductor chip 100. If the rigidity of the supporter 310 is greater than that of the first semiconductor chip 100, warpage of the first semiconductor chip 100 may be caused due to the supporter 310. For example, the supporter 310 may be formed of a material having a Young's modulus of about 10 GPa.

The supporter 310 may be formed of a material having a similar CTE to that of the first semiconductor chip 100. If the CTE of the supporter 310 is completely different from that of the first semiconductor chip 100, the supporter 310 may cause a stress to be exerted on the first semiconductor chip 100. For example, the supporter 310 may be formed of Invar having a similar CTE to that of Si.

In a structure not including the supporter 310, warpage of about 80 to about 100 μm is generated within the structure. In this case, the size of the first semiconductor chip 100 is 12 mm×12 mm, and the size of the second semiconductor chip 200 is 7.9 mm×8.1 mm. However, in a structure including the supporter 310, warpage of only about 30 μm is generated.

FIGS. 2A through 2F are plan views of stack packages according to various embodiments of the inventive concept. For a clear understanding, only the first semiconductor chip 100, the second semiconductor chip 200, and supporters 310a through 310f are illustrated.

Figure 2A:
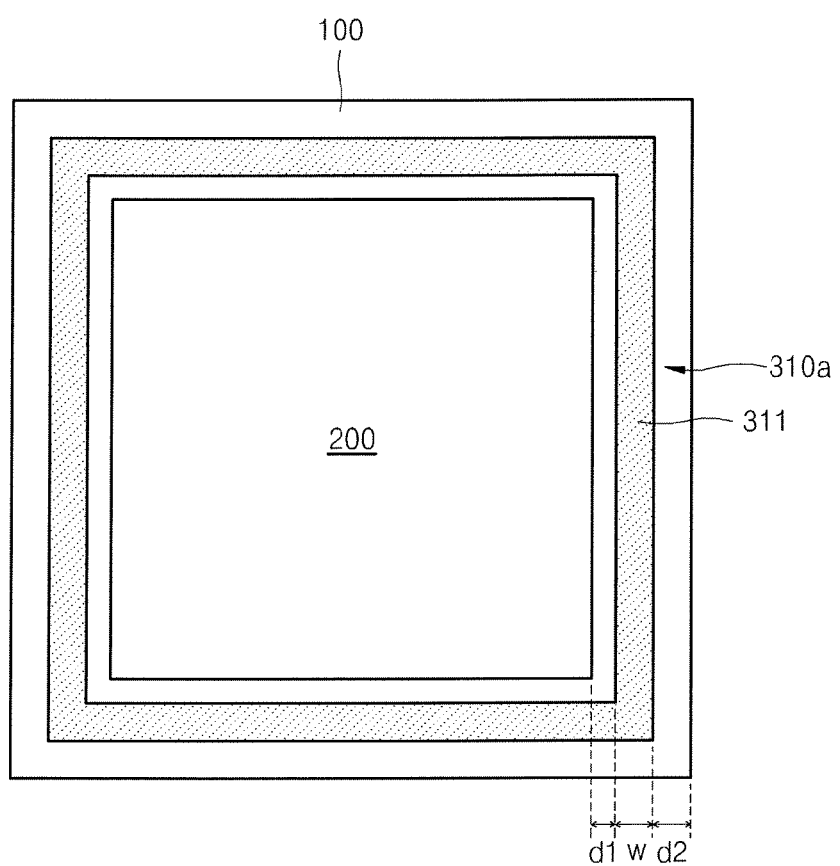
FIGS. 2A through 2F are plan views of stack packages according to various embodiments of the inventive concept.

Referring to FIG. 2A, the second semiconductor chip 200 is disposed on a central portion of the first semiconductor chip 100. A supporter 310a may include a ring-shaped portion 311 that is spaced apart from an edge (lateral surface or outer surface) of the second semiconductor chip 200 and surrounds the second semiconductor chip 200. The ring-shaped portion 311 may be disposed such that an outer surface 399a of the ring-shaped portion 311 may correspond to a lateral surface 299 of the first semiconductor chip 100. Also the ring-shaped portion 311 may be disposed such that an outer surface 399b of the ring-shaped portion 311 may correspond to a lateral surface 199 of the molding member 330. In this case, the first semiconductor chip 100 may be supported as much as possible by the supporter 311 and/or molding member 330. In addition, a width W of the ring-shaped portion 311 may be variously adjusted in consideration of a stress degree due to thermal expansion. Although the ring-shaped portion 311 is illustrated to have a rectangular shape along the lateral surfaces 299 of the first semiconductor chip 100, the ring-shaped portion 311 may have various shapes, such as a shape having circular, oval, or round corners with respect to the first semiconductor chip 100.

It is possible that the ring-shaped portion 311 may have various cross-sectional shapes in a direction perpendicular to the lateral surface 299 of the first semiconductor chip 100. For example, the cross-sectional shapes may include a rectangular shape, a circular shape, a round shape, a shape correspond to a shape of the molding member 330, etc. The lateral surfaces 199, 299, 399a and 399b may be perpendicular to a major surface of the first semiconductor chip 100 or the second semiconductor chip 200.

Referring to FIGS. 1 and 2A, a support unit 300 may include the supporter 310 and the adhesive layer 320. If the adhesive layer 320 is omitted, the support unit 300 may be directly attached to or formed on the first semiconductor chip 100 without the adhesive layer 320. The support unit 310 has a height H. Here, the width W and the height H of the support unit 300 may be a width and a height of the supporter 310 or a combination of the supporter 310 and the adhesive layer 320. The height H of the support unit 300 may be higher than a height of circuit devices 212 of the second semiconductor chip 200 with respect to an upper surface of the first semiconductor chip 100. The height of the support unit 300 may be lower than a height of the second semiconductor chip 200 with respect to an upper surface of the first semiconductor chip 100.

The width W of the support unit 300 may be wider than a distance d1 and a distance d2. The distance d1 may be greater than the distance d2. At lease one of the distance d1 and the distance d2 may be shorter than the width W or the height H. The supporter unit 300 may be disposed closer to lateral surface 199 than the lateral surface 399.

Figure 2B:
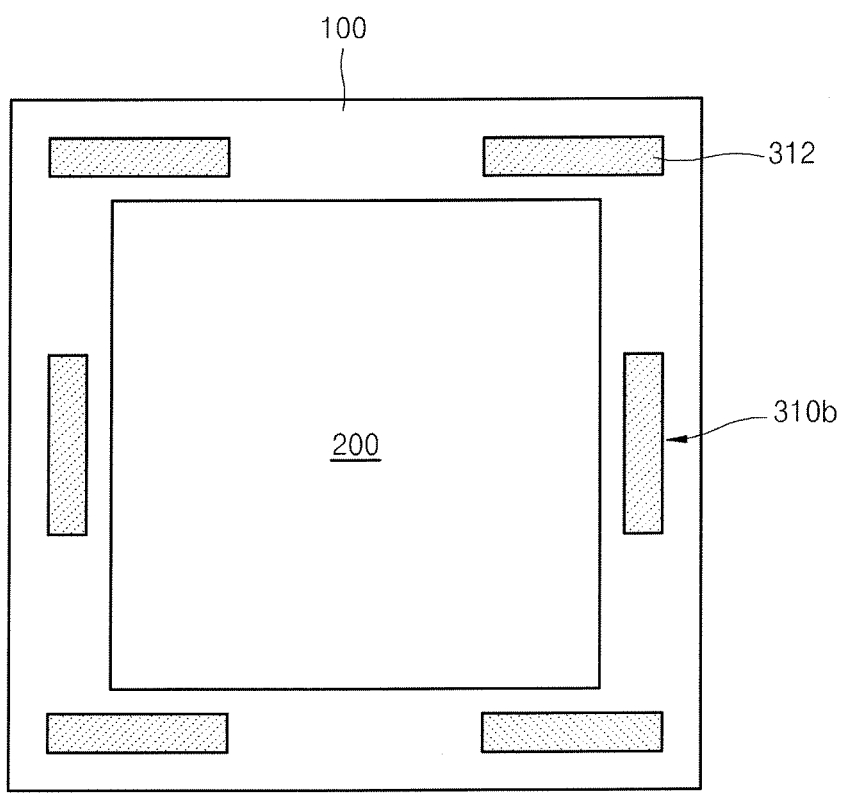

Referring to FIG. 2B, the second semiconductor chip 200 is disposed on a central portion of the first semiconductor chip 100. A supporter 310b may include bar-shaped portions 312 that extend along at least portions of a lateral surface 299 of the second semiconductor chip 200 at opposite ends thereof. As illustrated in FIG. 2B, two bar-shaped portions 312 may be disposed at each of upper and lower edges of the second semiconductor chip 200 in a direction along the lateral surface 299 of the second semiconductor chip 200, and one bar-shaped portion 312 may be disposed along each of right and left lateral surfaces 299 of the second semiconductor chip 200. This arrangement is illustrative, and thus may be variously changed, if necessary.

The bar-shaped portions 312 may be spaced apart from each other along the lateral surface 299 of the second semiconductor chip 200 by a distance. The distance may be longer than a width W of the supporter 310b. Since the width W of the bar-shaped portions 312 is thinner than the thickness of the molding member 330, a portion of the bar-shaped portions 312 may be extended from the corner portion of the second semiconductor chip 200 toward a corresponding lateral surface 199 of the molding member 330 as illustrated in FIG. 2B.

Figure 2C:
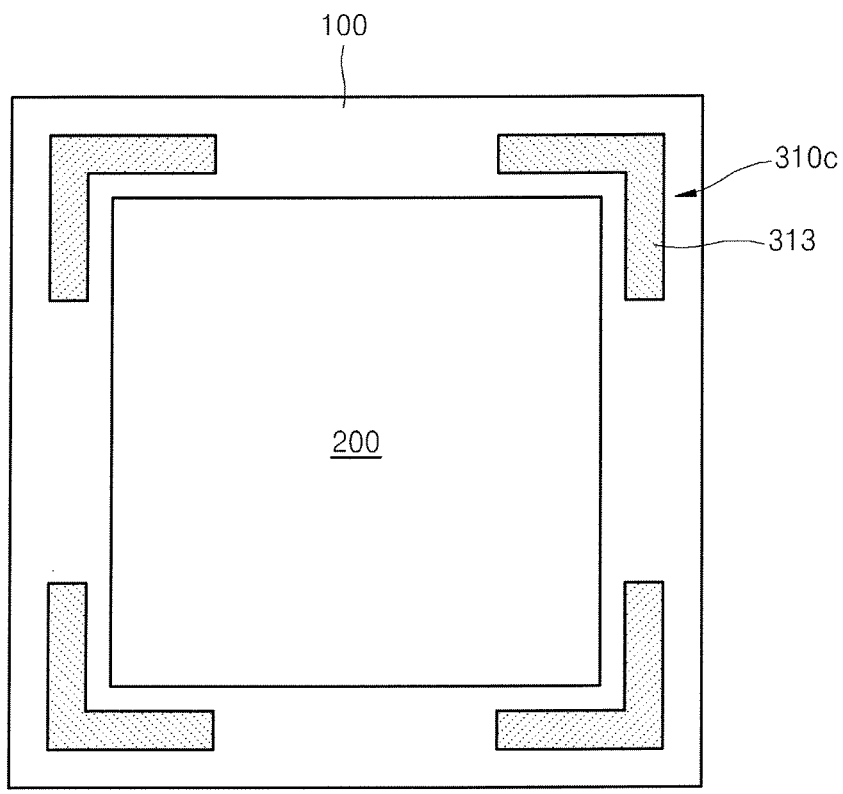

Referring to FIG. 2C, the second semiconductor chip 200 is disposed on a central portion of the first semiconductor chip 100. A supporter 310c may include corner reinforcing portions 313 to reinforce corner portions of the second semiconductor chip 200. The corner reinforcing portions 313 of the supporter 310c may be bent to correspond to the corner portions of the second semiconductor chip 200 and may be arranged adjacent to the corner portions of the second semiconductor chip 200. Although the corner reinforcing portions 313 are illustrated to be bent at a right angle, the present general inventive concept is not limited thereto. It is possible that the corner reinforcing portions 313 may be bent at an angle different from the right angle, if necessary. The corner reinforcing portions 313 may have extensions extended from a center thereof, and the extensions of the corner reinforcing portions 313 may be extended from a corner portion along the lateral surfaces 299 of the second semiconductor chip 200. In this case, the extensions may form an angle, for example, a right angle. Although the corner reinforcing portions 313 are illustrated to each have an "L" shape, the corner reinforcing portions 313 may have a different shape, for example, a cross shape where four extensions are extended from a center thereof which is disposed to correspond to the corner portion of the second semiconductor chip 200. In addition, the corner reinforcing portions 313 may not be disposed on all corner portions of the second semiconductor chip 200. The corner reinforcing portions 313 may have extensions extended from a center thereof, and the extensions of the corner reinforcing portions 313 may be extended from a corner portion along the lateral surfaces 299 of the second semiconductor chip 200.

Figure 2D:
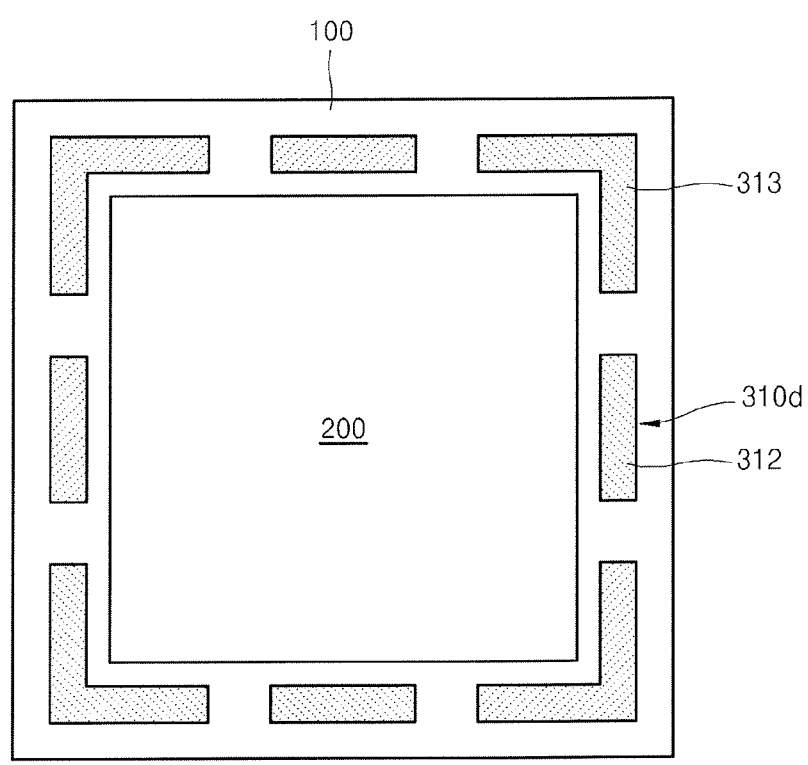

Referring to FIG. 2D, the second semiconductor chip 200 is disposed on a central portions of the first semiconductor chip 100. A supporter 310d may include bar-shaped portions 312 that extend along at least portions of a lateral surface 299 of the second semiconductor chip 200, and corner reinforcing portions 313 that are bent so as to correspond to corner portions of the second semiconductor chip 200 and are arranged adjacent to the corner portions of the second semiconductor chip 200. The size of each bar-shaped portion 312 and the size of each corner reinforcing portion 313 may vary, if necessary. For example, if an area of the supporter 310d is too large, the first semiconductor chip 100 and the second semiconductor chip 200 may not be sufficiently sealed by the molding member 330 (see FIG. 1) which is later formed after the supporter 310d is formed. The supporter 310d of FIG. 2D may be a combination of the supporter 310b of FIG. 2B and the supporter 310c of FIG. 2C.

Figure 2E:
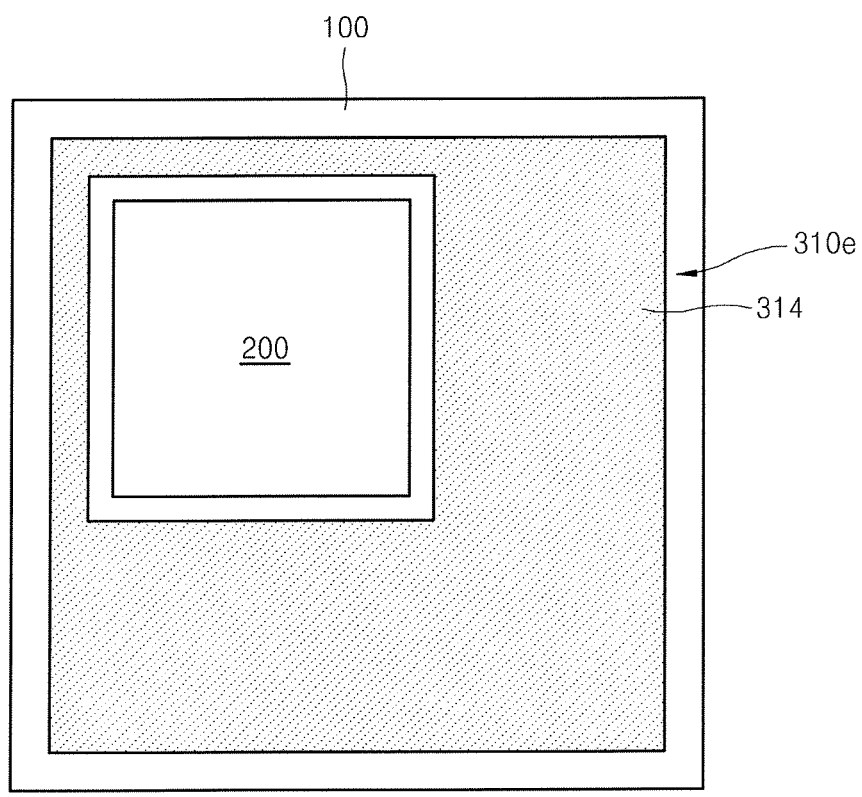

Referring to FIG. 2E, a central portion of the second semiconductor chip 200 is disposed different from a central portion of the first semiconductor chip 100 in a predetermined direction of the central portion of the first semiconductor chip 100. This arrangement may provide an efficient electrical connection between the second semiconductor chip 200 and the first semiconductor chip 100. A supporter 310e may include an asymmetrical portion 314 that is asymmetrically disposed with respect to the second semiconductor chip 200. That is, a width W of the asymmetrical portion 314 may vary according to a direction from a central portion of the second semiconductor chip 200 or a central portion of the first semiconductor chip 200. The asymmetrical portion 314 may have different widths W with respect to the corresponding lateral surface 199 of the molding member 330 or the corresponding lateral surface of the second semiconductor chip 200. It is possible that the lateral surface 399a of the supporter 310e may be disposed and spaced apart from the corresponding lateral surface 299 of the second semiconductor chip 200 by a same distance. A stress due to thermal expansion increases in a portion of the first semiconductor chip 100, which is not covered by the second semiconductor chip 200, compared to another portion of the first semiconductor chip 100 which is covered by the second semiconductor chip 200 or on which the second semiconductor chip 200 is disposed. Thus, as illustrated in FIG. 2E, the first semiconductor chip 100 may have a first area (or a first width) in a portion where the second semiconductor chip 200 is disposed, and may have a second area (or a second width) in an opposite portion where the second semiconductor chip 200 is not disposed. Here, the first area may be smaller than the second area or the first width may be narrower than the second width. However, the present general inventive concept is not limited thereto. The first area and the first width may vary with respect to the second area and the second width, respectively.

Figure 2F:
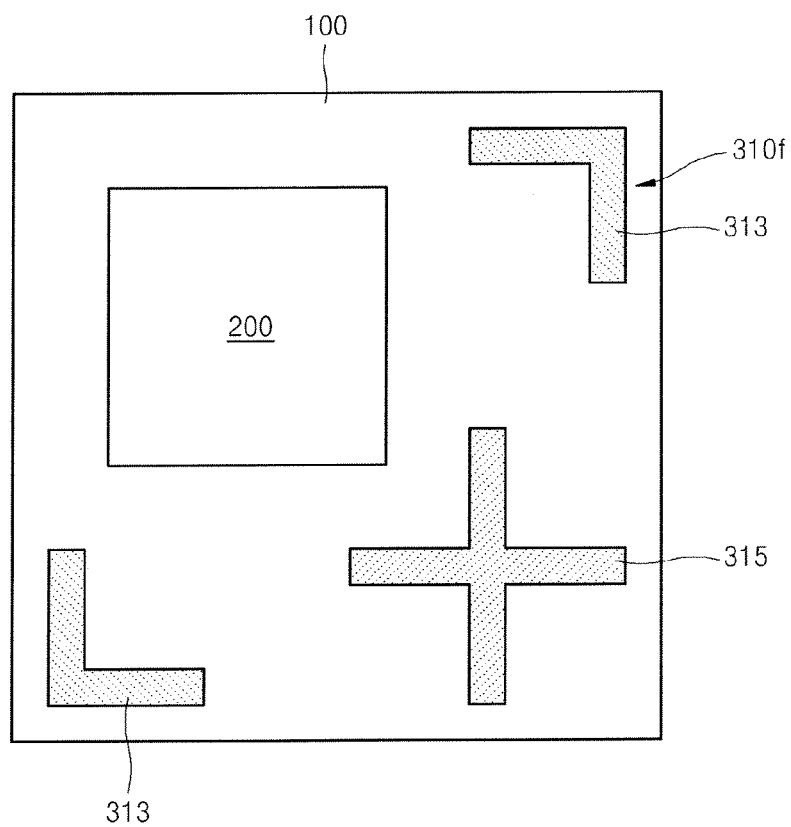

Referring to FIG. 2F, a central portion of the second semiconductor chip 200 is disposed away from a central portion of the first semiconductor chip 100 and disposed towards a predetermined direction of the first semiconductor chip 100. A supporter 310f may include a structure to reinforce a portion of an opposite direction to the predetermined direction towards which the second semiconductor chip 200 is disposed. As illustrated in FIG. 2F, the corner reinforcing portions 313 may be disposed at top right portions and bottom left portions of the first semiconductor chip 100. In addition, a cross-shaped portion 315 may be disposed at a bottom right portion of the first semiconductor chip 100. It is possible that a combination of portions of the supporters 310a, 310b, 310c, 310d, 310e, and 310f of FIGS. 2A through 2F cane be formed as a supporter according to an embodiment of the present general inventive concept.

In FIGS. 2A through 2F, the supporter 310 has various shapes, but is not limited thereto. The shapes of the supporter 310 of FIGS. 2A through 2F are exemplary, and thus the supporter 310 may have various shapes according to the sizes, thicknesses, and arrangement of the first semiconductor chip 100 and the second semiconductor chip 200.

Figure 3A:
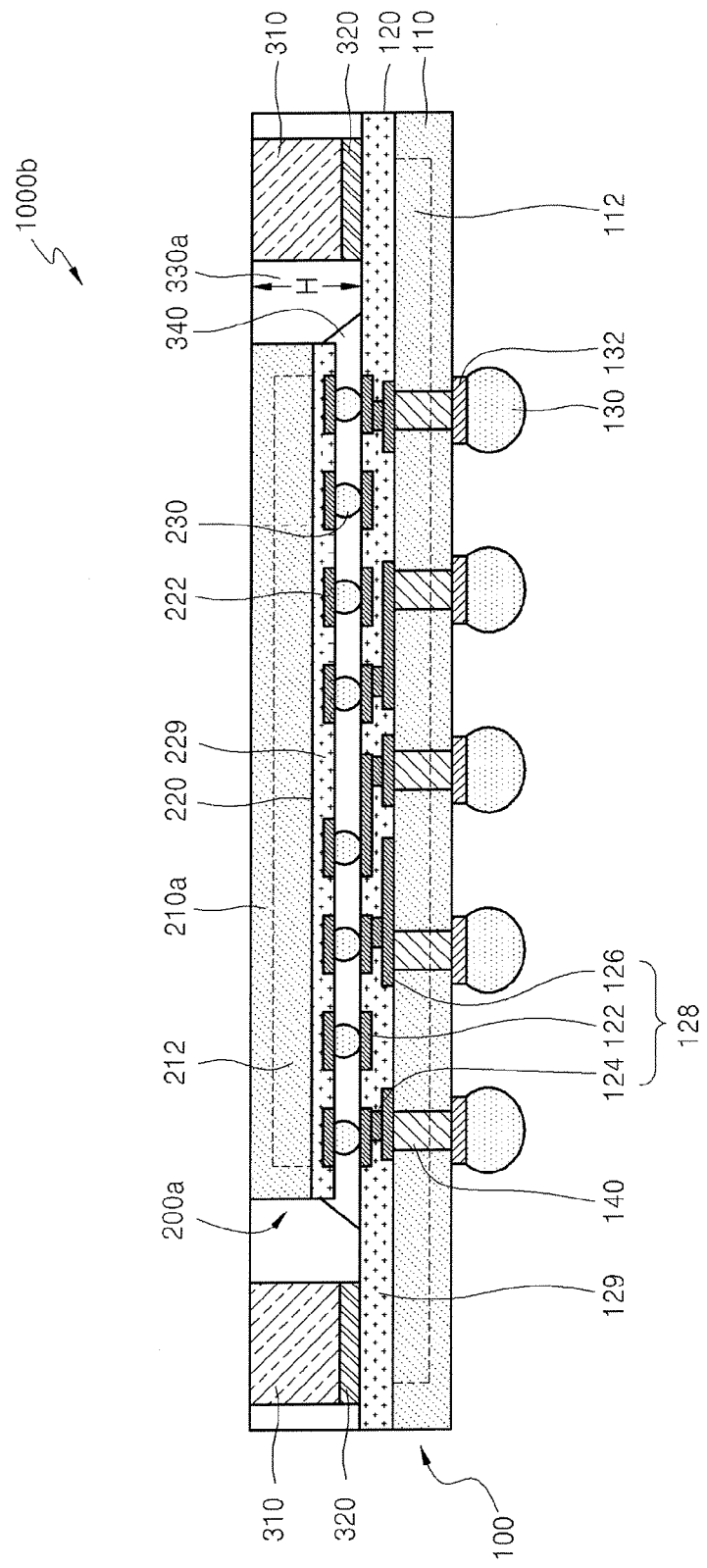
FIG. 3A is a cross-sectional view of a stack package according to another embodiment of the inventive concept.

FIG. 3A is a cross-sectional view of a stack package 1000b according to another embodiment of the inventive concept.

Referring to FIG. 3A, the stack package 1000b include a first semiconductor chip 100, a second semiconductor chip 200a, a supporter 310, and a molding member 330a. The first semiconductor chip 100 and the supporter 310 of FIG. 3A are formed of the same materials as the first semiconductor chip 100 and the supporter 310 of FIG. 1, respectively, and thus detail descriptions thereof will not be stated. In addition, the second semiconductor chip 200a and the molding member 330a of FIG. 3A are similar to the second semiconductor chip 200 and the molding member 330 of FIG. 1, respectively, but their heights are different. And thus detail descriptions thereof will not be repeated again.

The second semiconductor chip 200a includes a semiconductor layer 210a. The semiconductor layer 210a may include the circuit devices 212, like the semiconductor layer 210 of FIG. 1. However, the semiconductor layer 210a may have a height H than the semiconductor layer 210 of FIG. 1 such that an upper surface of the semiconductor layer 210a may be disposed at the same layer level as an upper surface of the supporter 310. The semiconductor layer 210a may be formed by removing an upper portion of the semiconductor layer 210 of FIG. 1, which will be described later in detail with reference to FIGS. 13D through 13E.

The molding member 330a may expose the upper surface of the semiconductor layer 210a and the upper surface of the supporter 310. The molding member 330a may be formed by removing an upper portion of the molding member 330 of FIG. 1. The upper portion of the molding member 330 and the upper portion of the semiconductor layer 210 may be simultaneously removed, which will be described later in detail with reference to FIGS. 13D through 13E.

The stack package 1000b of FIG. 3A has a thickness thinner (or height lower) than that of the stack package 1000a of FIG. 1. As described above, since a stress due to thermal expansion is proportional to a thickness, a stress generated in the stack package 1000b of FIG. 3A may be smaller than that of the stack package 1000a of FIG. 1. Thus, warpage of the stack package 1000b is reduced.

In addition, in the stack package 1000b, an upper surface of the semiconductor layer 210a is exposed. Thus, heat generated from the semiconductor layer 210a may be dissipated therethrough rather than blocked by a sealing member, for example, an upper portion of the molding member 330.

Figure 3B:
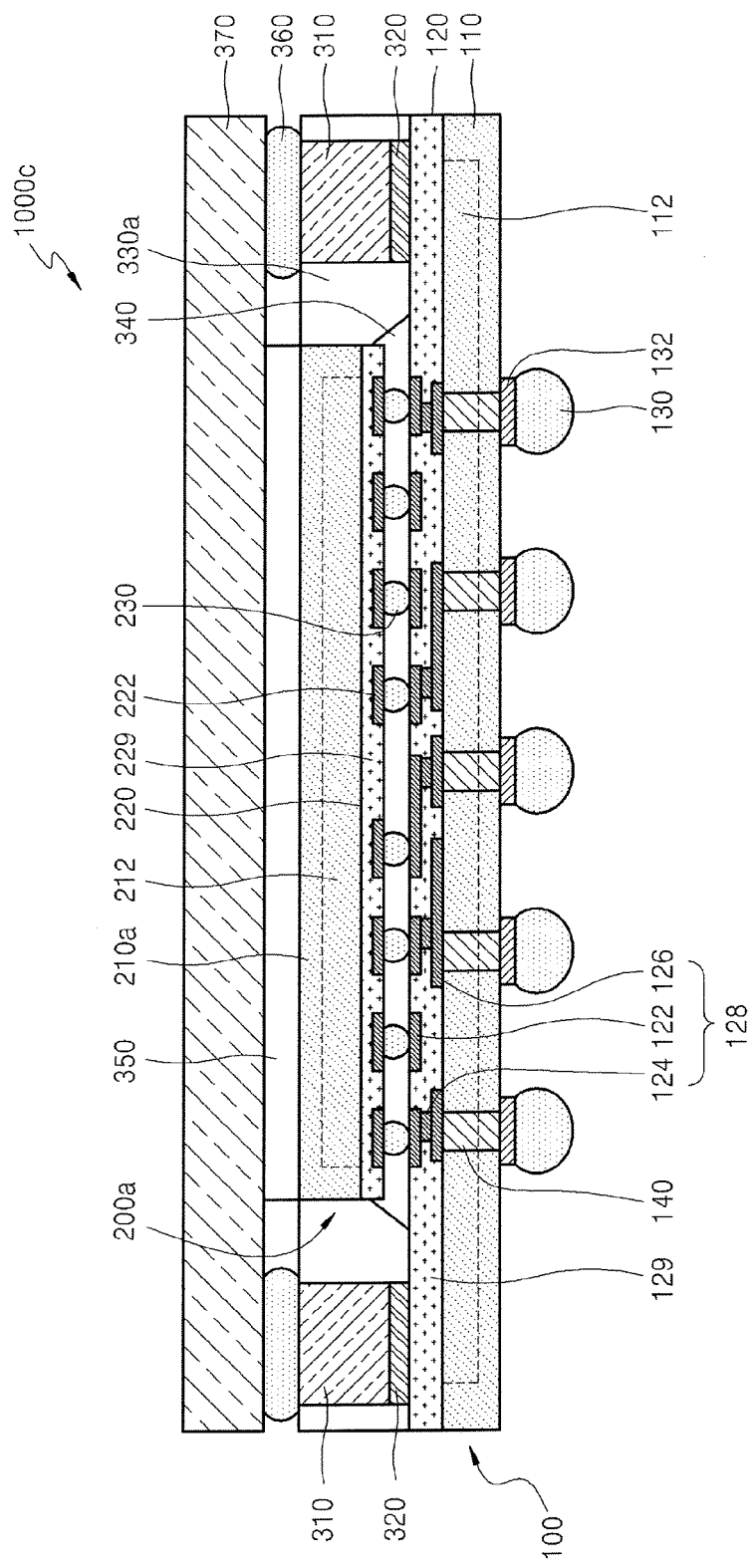
FIG. 3B is a cross-sectional view of a stack package according to another embodiment of the inventive concept.

FIG. 3B is a cross-sectional view of a stack package 1000c according to another embodiment of the inventive concept.

Referring to FIG. 3B, the stack package 1000c includes the first semiconductor chip 100, the second semiconductor chip 200a, the supporter 310, the molding member 330a, and a heat spreader 370. The first semiconductor chip 100, the second semiconductor chip 200a, the supporter 310, and the molding member 330a have been described with reference to FIG. 3A, and thus will not be described again.

The heat spreader 370 may be disposed on the semiconductor layer 210a of the second semiconductor chip 200a. The heat spreader 370 may be formed of a metal material having high heat conductivity, such as Al, Fe, Cu, or an alloy thereof. The heat spreader 370 may be a separate component included in the stack package 1000c, or may be another component of a final semiconductor package, which will be described in detail, with reference to FIGS. 8 through 10. The heat spreader 370 may receive heat generated and transmitted from the stack package 1000c, for example, at least from the second semiconductor chip 200a, and then dissipate the received heat outside the stack package 1000c.

A thermal interface material layer 350 may be inserted or disposed between the heat spreader 370 and an upper surface of the semiconductor layer 210a. The thermal interface material layer 350 is provided to dissipate heat generated from the circuit devices 212 of the semiconductor layer 210a to the heat spreader 370 in a desirable manner. The thermal interface material layer 350 may be formed of a thermal interface material (TIM). Examples of the TIM may include a solder, a polymer, a polymer gel, and polymer/solder hybrid. Other examples of the TIM may include a thermal interface sheet or grease.

A solder layer 360 may be disposed or inserted between the heat spreader 370 and an upper surface of the supporter 310. The solder layer 360 fixes the heat spreader 370 onto the supporter 310. The solder layer 360 may be replaced by a thermal interface adhesive tape. It is possible that the solder layer 360 may be integrated in the thermal interface material layer 350. The solder layer 360 and the thermal interface material layer 350 may be formed as a single monolithic body.

The stack package 1000c of FIG. 3B may improve heat dissipation properties, compared to the stack package 1000b, while still having the advantages of the stack package 1000b of FIG. 3A.

Figure 4:
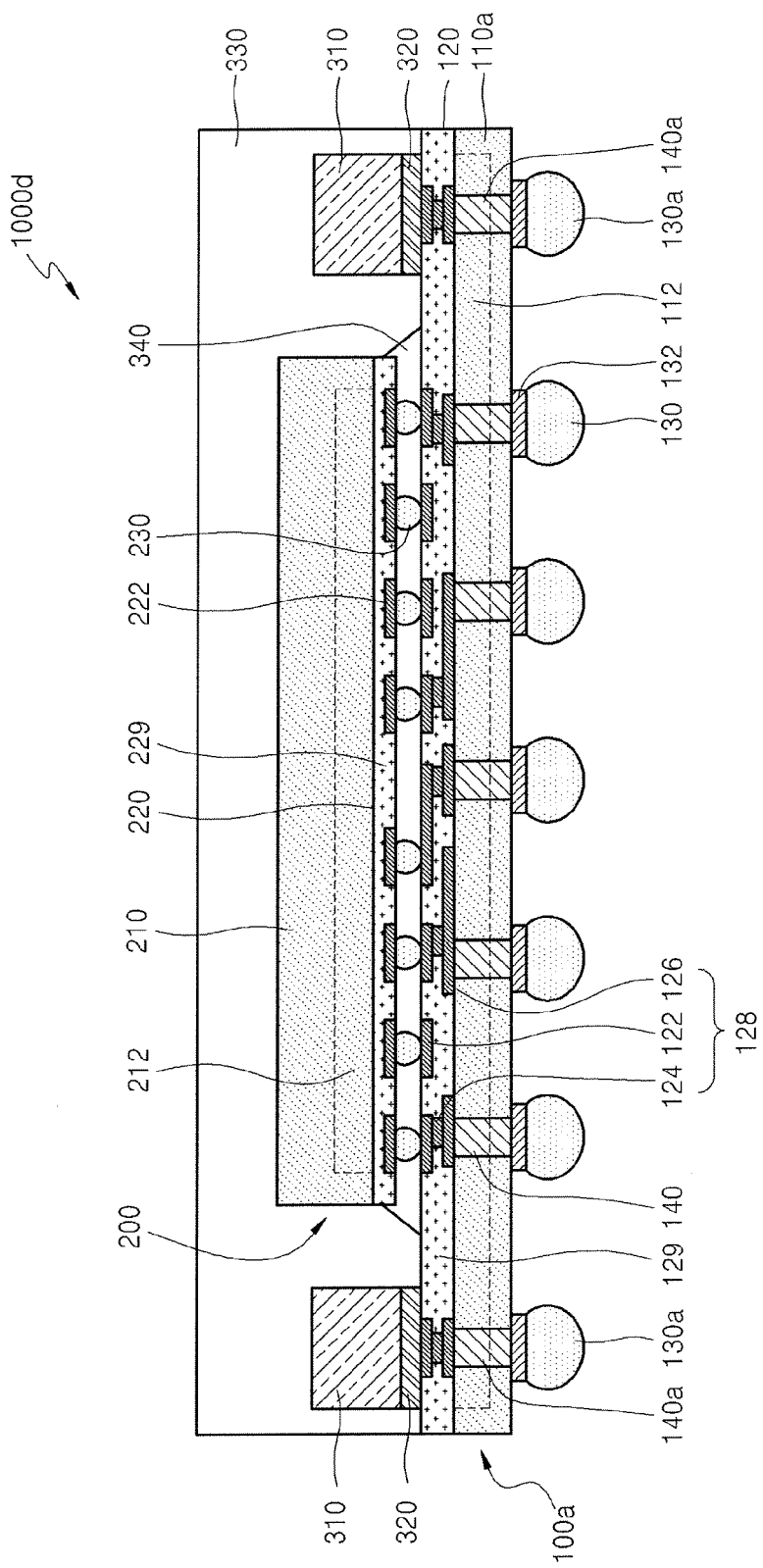
FIG. 4 is a cross-sectional view of a stack package according to another embodiment of the inventive concept.

FIG. 4 is a cross-sectional view of a stack package 1000d according to another embodiment of the inventive concept.

Referring to FIG. 4, the stack package 1000d includes a first semiconductor chip 100a, the second semiconductor chip 200, the supporter 310, and the molding member 330. The second semiconductor chip 200, the supporter 310, and the molding member 330 have been described with reference to FIG. 1, and thus will not be described again.

The first semiconductor chip 100a of FIG. 4 is similar to the first semiconductor chip 100 of FIG. 1, but is different from the first semiconductor chip 100 in that the first semiconductor chip 100a includes heat dissipation TSVs 140a formed in the first semiconductor chip 110a. A component of FIG. 4 that is similar to the first semiconductor chip 100 of FIG. 1 will not be described again.

The heat dissipation TSVs 140a may be connected the supporter 310 so that heat may be transferred between heat dissipation TSVs 140a and the supporter 310. The heat dissipation TSVs 140a may be formed through a portion of the first semiconductor chip 110a in which the circuit devices 112 are formed. The supporter 310 and the heat dissipation TSVs 140a may be connected so that heat may be transferred (transmitted) between the supporter 310 and the heat dissipation TSVs 140a by using the wiring patterns 128 of the wiring layer 120. The wiring patterns 128 may connect the heat dissipation TSVs 140a and the circuit devices 112 to each other. The adhesive layer 320 may include a material having high heat conductivity and adhesive properties so that heat may be transferred between the wiring layer 120 and the supporter 310.

Heat dissipation connection bumps 130a are connected to the heat dissipation TSVs 140a so as to provide a path for dissipating heat flowing along the heat dissipation TSVs 140a outside the stack package 1000d. The heat dissipation connection bumps 130a may be formed of the same material as the connection bumps 130, except for their positions.

Heat generated from the semiconductor layer 110a may be transmitted to the supporter 310 through the heat dissipation TSVs 140a, and the supporter 310 may dissipate the heat outside thereof. In addition, the heat may be transmitted to the heat dissipation connection bumps 130a through the heat dissipation TSVs 140a, and may be dissipated outside the stack package 1000d through the heat dissipation connection bumps 130a.

A ground voltage (VSS) or a power voltage (VDD) may be applied from an external source through the heat dissipation connection bumps 130a. The applied voltages VSS or VDD may be provided to the circuit devices 112, and may also be provided to the circuit devices 212 of the second semiconductor chip 200 through the wiring patterns 128 and the micro connection bumps 230.

Figure 5:
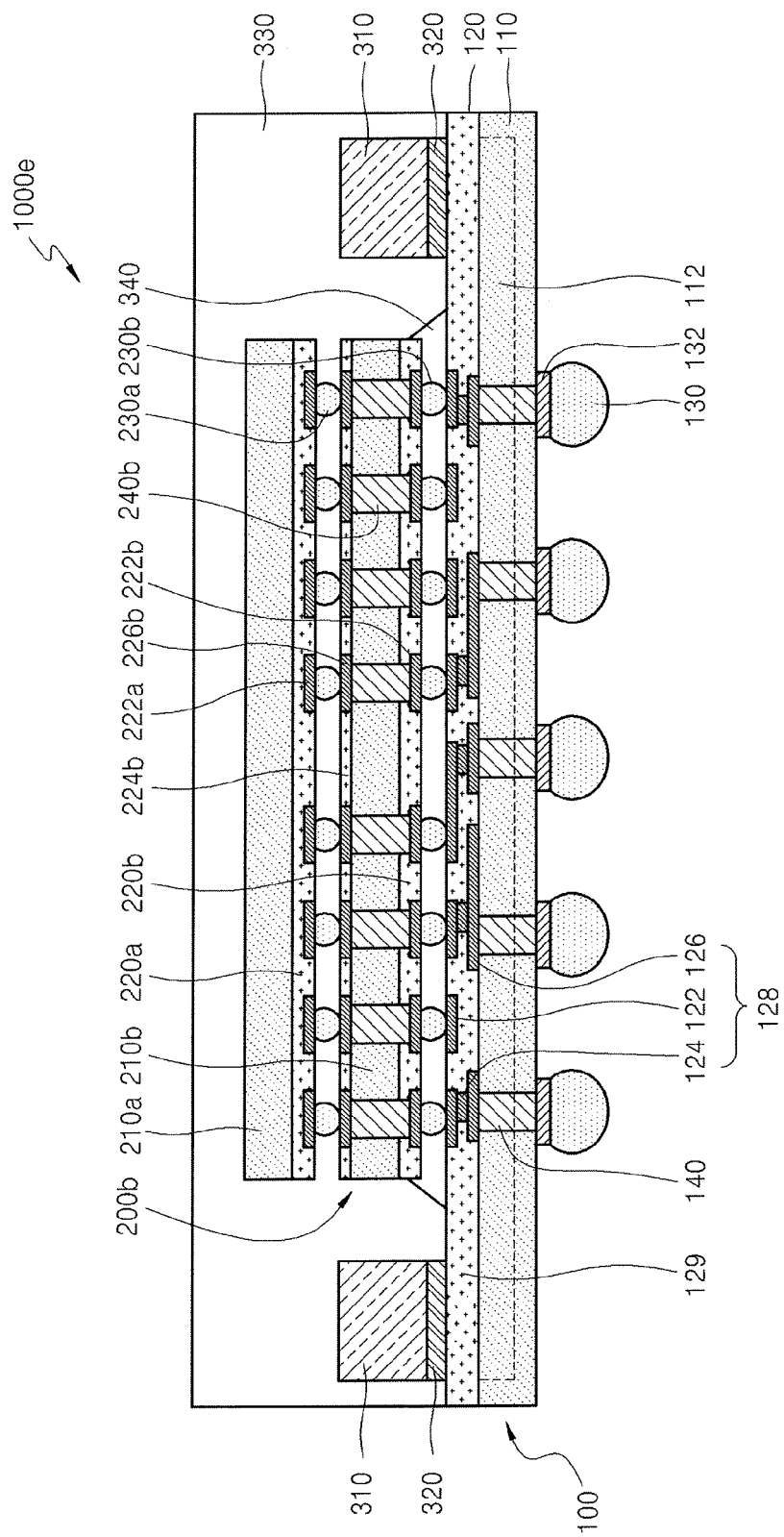
FIG. 5 is a cross-sectional view of a stack package according to another embodiment of the inventive concept.

FIG. 5 is a cross-sectional view of a stack package 1000e according to another embodiment of the inventive concept.

Referring to FIG. 5, the stack package 1000e includes the first semiconductor chip 100, a second semiconductor chip 200b, the supporter 310, and the molding member 330. The first semiconductor chip 100, the supporter 310, and the molding member 330 have been described with reference to FIG. 1, and thus will not be described again.

The second semiconductor chip 200*b* may include a plurality of sub-semiconductor chips stacked on each other. The second semiconductor chip 200*b* may include two layers of an upper semiconductor chip and a lower semiconductor chip, as shown in FIG. 5. However, this is just an example, and thus, three or more layers may be stacked.

The upper semiconductor chip of the second semiconductor chip 200*b* includes the semiconductor layer 210*a*, lower wiring layers 220*a*, and micro connection bumps 230*a*.

Circuit devices (not shown) may be formed in the semiconductor layer 210*a*. The circuit devices may each be a memory device such as a volatile memory device, or a nonvolatile memory device. The micro connection bumps 230*a* are terminals to input and output signals to and from the circuit devices, and may be provided to connect the upper semiconductor chip to the lower semiconductor chip. The lower wiring layer 220*a* may include an insulating layer and one or more wiring patterns 222*a*. The wiring patterns 222*a* may electrically connect the circuit devices and the micro connection bumps 230*a* to each other, and may include a pad to which the micro connection bumps 230*a* are attached.

The lower semiconductor chip of the second semiconductor chip 200*b* may include a semiconductor layer 210*b*, a lower wiring layer 220*b*, an upper wiring layer 224*b*, micro connection bumps 230*b*, and micro TSVs 240*b*.

Circuit devices (not shown) may be formed in the semiconductor layer 210*b*. The circuit devices may each be a memory device such as a volatile memory device or a nonvolatile memory device. The micro TSVs 240*b* may be electrically connected to the circuit devices of the semiconductor layer 210*b*, and may be formed through the semiconductor layer 210*b*. Signals may be transferred among the upper semiconductor chips, the lower semiconductor chip, and the firs semiconductor chip through the micro TSVs 240*b*. The micro connection bumps 230*b* may be terminals to input and output signals to and from the circuit devices, may be electrically connected to the micro TSVs 240*b*, and may be provided to connect the lower semiconductor chip to the first semiconductor chip 100. The lower wiring layer 220*b* may include an insulating layer and one or more wiring patterns 222*b*. The wiring patterns 222*b* may electrically connect the circuit devices and the micro connection bumps 230*b* to each other, and may include a pad to which the micro connection bumps 230*b* are attached. The upper wiring layer 224*b* may include an insulating layer and wiring patterns 226*b*. The wiring patterns 226*b* may be electrically connected to the micro TSVs 240*b*, and may include a pad to which the micro connection bumps 230*b* of the upper semiconductor chip are to be connected.

In FIG. 5, the upper semiconductor chip is connected to the lower semiconductor chip by using the micro connection bumps 230*b*. However, this method is just an example, and the upper semiconductor chip may be connected to the lower semiconductor chip by using another method. For example, the upper semiconductor chip and the lower semiconductor chip may be connected to each other through a TSV formed through the upper semiconductor chip and the lower semiconductor chip. In addition, in FIG. 5, the second semiconductor chip 200*b* is connected to the first semiconductor chip 100 through the micro connection bumps 230*b*. However, this method is just an example, and the second semiconductor chip 200*b* may be connected to the first semiconductor chip 100 by using various methods using a bonding wire.

An upper surface of the supporter 310 may have a height to correspond to a height of an upper surface of the lower semiconductor chip of the second semiconductor chip 200*b* with respect to the first semiconductor chip 100. The height of the upper surface of the supporter 310 may not higher than that of the upper semiconductor chip of the second semiconductor chip 200*b*. It is possible that since areas of the upper and lower semiconductor chips of the second semiconductor chip 200*b* are same with respect to the first semiconductor chip 100, the supporter 310 may not be extended to correspond to a lateral surface of the upper semiconductor chip of the second semiconductor chip 200*b* as long as the warpage is prevented.

Various features shown in FIGS. 1 through 5 may each be used alone to embody a stack package, but may be combined to embody a stack package according to an embodiment of the present general inventive concept.

Figure 6:
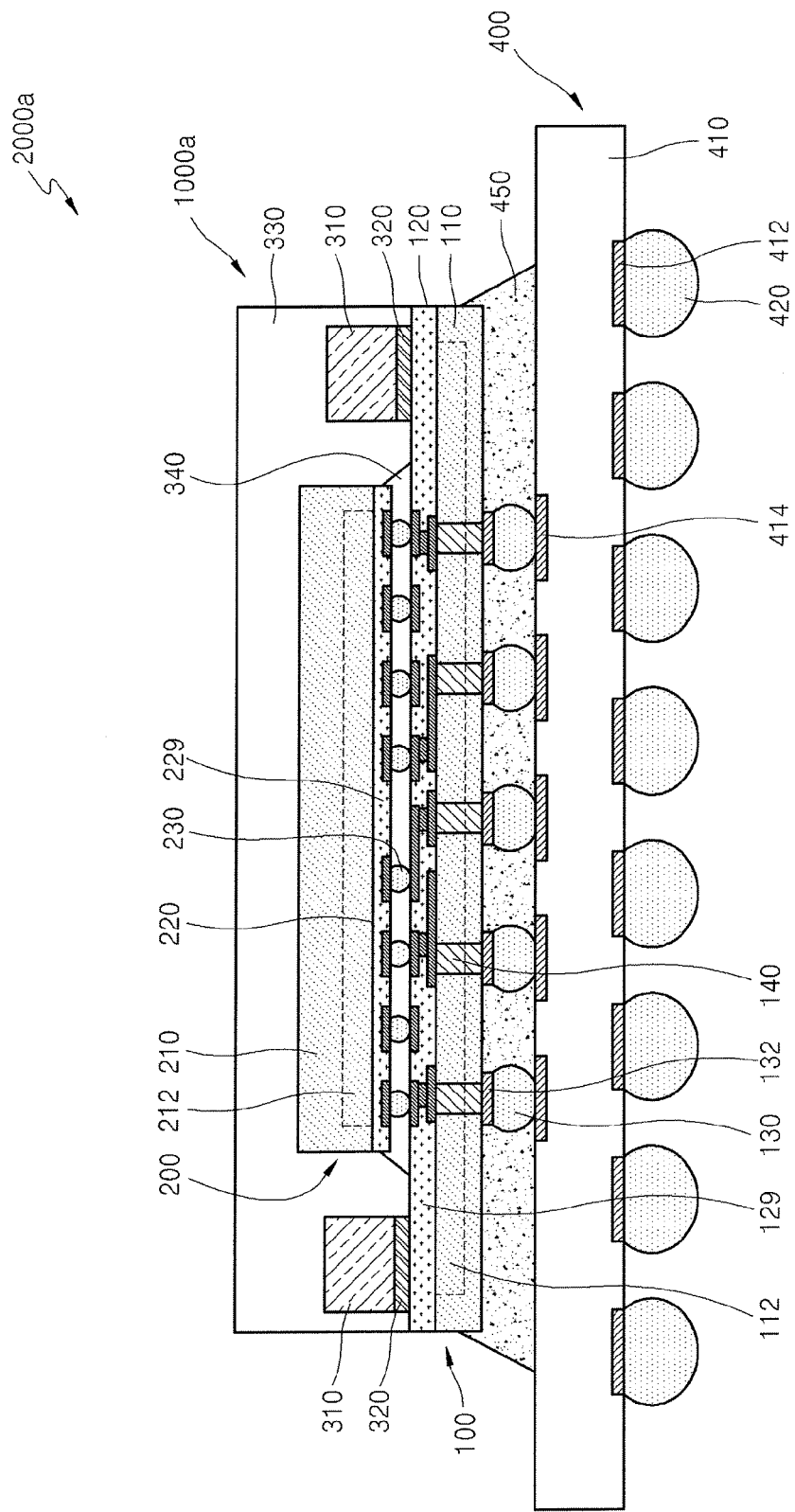
FIG. 6 is a cross-sectional view of a semiconductor package according to an embodiment of the inventive concept.

FIG. 6 is a cross-sectional view of a semiconductor package 2000*a* according to an embodiment of the inventive concept.

Referring to FIG. 6, the semiconductor package 2000*a* includes a first substrate 400, and the stack package 1000*a* of FIG. 1. The stack package 1000*a* includes the first semiconductor chip 100, the second semiconductor chip 200, the supporter 310, and an internal molding member 330.

The first semiconductor chip 100 is installed on the first substrate 400, and includes the TSVs 140. The second semiconductor chip 200 is stacked onto the first semiconductor chip 100, and is electrically connected to the first semiconductor chip 100 through the TSVs 140 of the first semiconductor chip 100. The supporter 310 is spaced apart from an edge or a lateral surface of the second semiconductor chip 200, and is attached to the first semiconductor chip 100. The internal molding member 330 covers an upper surface of the first semiconductor chip 100 and/or the supporter 310 such that the second semiconductor chip 200 and the supporter 310 are sealed from an outside thereof.

The stack package 1000*a* including the first semiconductor chip 100, the second semiconductor chip 200, the supporter 310, and the internal molding member 330 of FIG. 6 is formed of the same material as that of FIG. 1, and has been described with reference to FIG. 1, and thus will not be described herein again.

The first substrate 400 may include a base layer 410, first substrate pads 414, and external connection pads 412. Although not illustrated in FIG. 6, a wiring pattern (not shown) for connecting the first substrate pads 414 and the external connection pads 412 to each other is disposed in the base layer 410. The first substrate 400 may be a printed circuit board (PCB), and the PCB may include a multi-layered structure including wiring patterns formed therein.

The base layer 410 may include an epoxy resin, a polyimide resin, a bismaleimide triazine (BT) resin, flame retardant 4 (FR-4), FR-5, ceramic, Si, or glass, which is just an example, and thus the inventive concept is not limited thereto.

For example, the first substrate 400 may be a single rigid substrate, may be formed by attaching a plurality of rigid substrates to each other, or may be formed by attaching or combining a thin flexible PCB and a rigid flat substrate. The rigid substrates may each include a wiring pattern and a connection pad. In addition, the first substrate 400 may be a low temperature co-fired ceramic (LTCC) substrate. The LTCC substrate includes a plurality of ceramic layers and wiring patterns formed therein.

As illustrated in FIG. 6, the first substrate pads 414 may be connected to the connection bumps 130 of the first semiconductor chip 100, and solder balls 420 may be attached to the external connection pads 412. The solder balls 420 may be used for electrical connection with an external device, and may be formed of a material including tin (Sn) and lead (Pb). The solder balls 420 may be formed of metal such as nickel (Ni), gold (Au), silver (Ag), copper (Cu), and bismuth (Bi).

Although eight solder balls 420 are illustrated in FIG. 6, this is just an example, and thus the number of the solder balls 420 may be changed, if necessary.

The stack package 1000a may be installed on the first substrate 400. The connection bumps 130 of the first semiconductor chip 100 may be disposed to be connected to the first substrate pads 414 of the first substrate 400. An underfill layer 450 may be inserted between the first substrate 400 and the first semiconductor chip 100 so that the stack package 1000a may be attached to the first substrate 400. The underfill layer 450 may include epoxy, benzocyclobutyne, or polyimide.

The first semiconductor chip 100 of the stack package 1000a is exposed to the outside, and may be vulnerable to external shocks. Thus, since the stack package 1000a is installed on the first substrate 400 such as a PCB, the first semiconductor chip 100 and the second semiconductor chip 200 may be protected from external shocks. Since the first substrate 400 is flat and has high rigidity, warpage of the stack package 1000a may be prevented.

Figure 7:
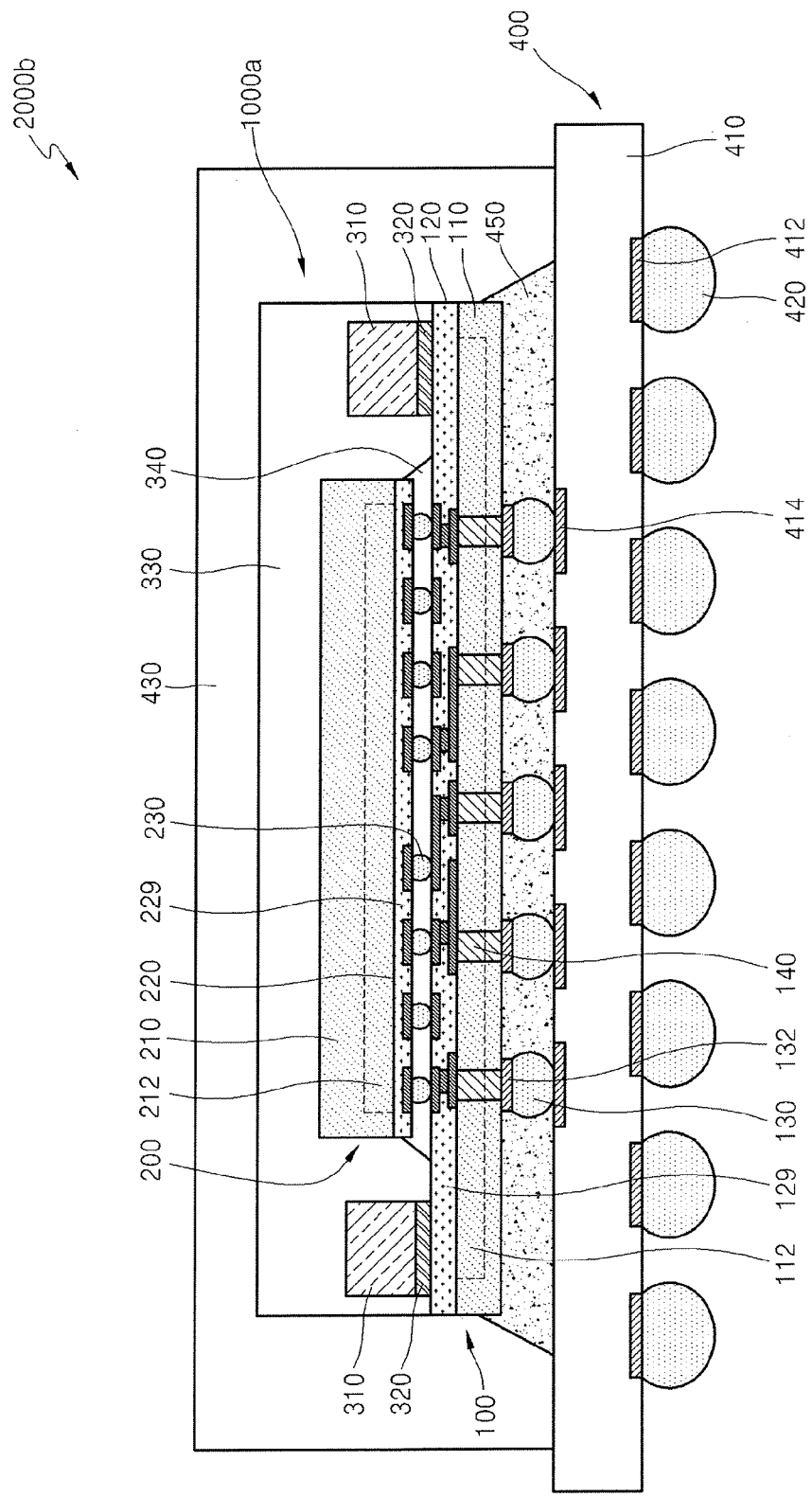
FIG. 7 is a cross-sectional view of a semiconductor package according to an embodiment of the inventive concept.

FIG. 7 is a cross-sectional view of a semiconductor package 2000b according to an embodiment of the inventive concept.

Referring to FIG. 7, the semiconductor package 2000b includes the first substrate 400, the stack package 1000a, and an external molding member 430. The stack package 1000a includes the first semiconductor chip 100, the second semiconductor chip 200, the supporter 310, and the internal molding member 330.

The first substrate 400 and the stack package 1000a have been described with reference to FIGS. 6 and 1, and thus will not be described again.

The external molding member 430 may cover an upper surface of the first substrate 400 to seal the stack package 1000a including the first semiconductor chip 100 and the internal molding member 330. The external molding member 430 may be an epoxy molding compound (EMC). The EMC may include an epoxy resin and a thermosetting resin.

The internal molding member 330 of the stack package 1000a may be formed of a material having a Young's modulus of about 1 GPa in order to prevent warpage due to a stress caused by thermal expansion. The internal molding member 330 having such high flexibility may absorb external shocks, but may be vulnerable with respect to external pressure, heat, moisture, or the like. By sealing the internal molding member 330 and the stack package 1000a by using the external molding member 430, the semiconductor package 2000b may be protected from external heat, moisture, shocks, or pressure.

Figure 8:
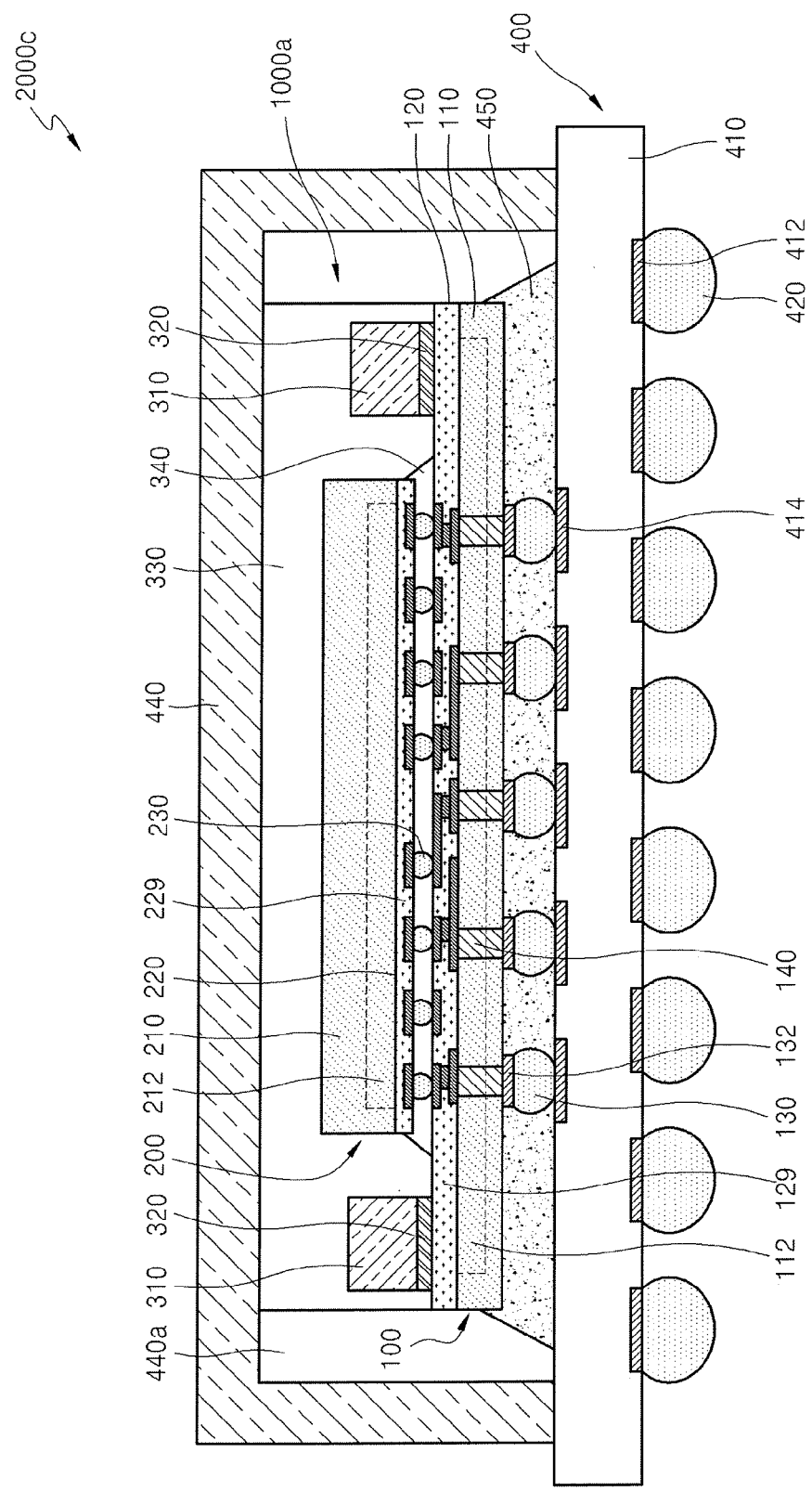
FIG. 8 is a cross-sectional view of a semiconductor package according to another embodiment of the inventive concept.

FIG. 8 is a cross-sectional view of a semiconductor package 2000c according to another embodiment of the inventive concept.

Referring to FIG. 8, the semiconductor package 2000c includes the first substrate 400, the stack package 1000a, and a heat spreader 440. The stack package 1000a includes the first semiconductor chip 100, the second semiconductor chip 200, the supporter 310, and the internal molding member 330.

The first substrate 400 and the stack package 1000a have been described with reference to FIGS. 6 and 1, and thus will not be described herein again.

The heat spreader 440 may be disposed to surround the stack package 1000a including the first semiconductor chip 100 and the internal molding member 330, and the heat spreader 440 may contact an upper surface of the stack package 1000a. The heat spreader 440 may be fixed to the first substrate 400. The heat spreader 440 may include a material having high heat conductivity, such as Al, Fe, Cu, or an alloy thereof. An adhesive layer or an adhesive film may be used to fix the heat spreader 440 to the first substrate 400.

The heat spreader 440 may dissipate heat generated from the first and second semiconductor chips 100 and 200 to an outside of the semiconductor package 2000c while protecting the stack package 1000a from external factors.

The heat spreader 440 may have a portion spaced apart from a lateral (side) surface of the stack package 1000a to provide a space 440a. The space 440a may be filled with a material, such as air, heat transmitting material, etc.

Figure 9:
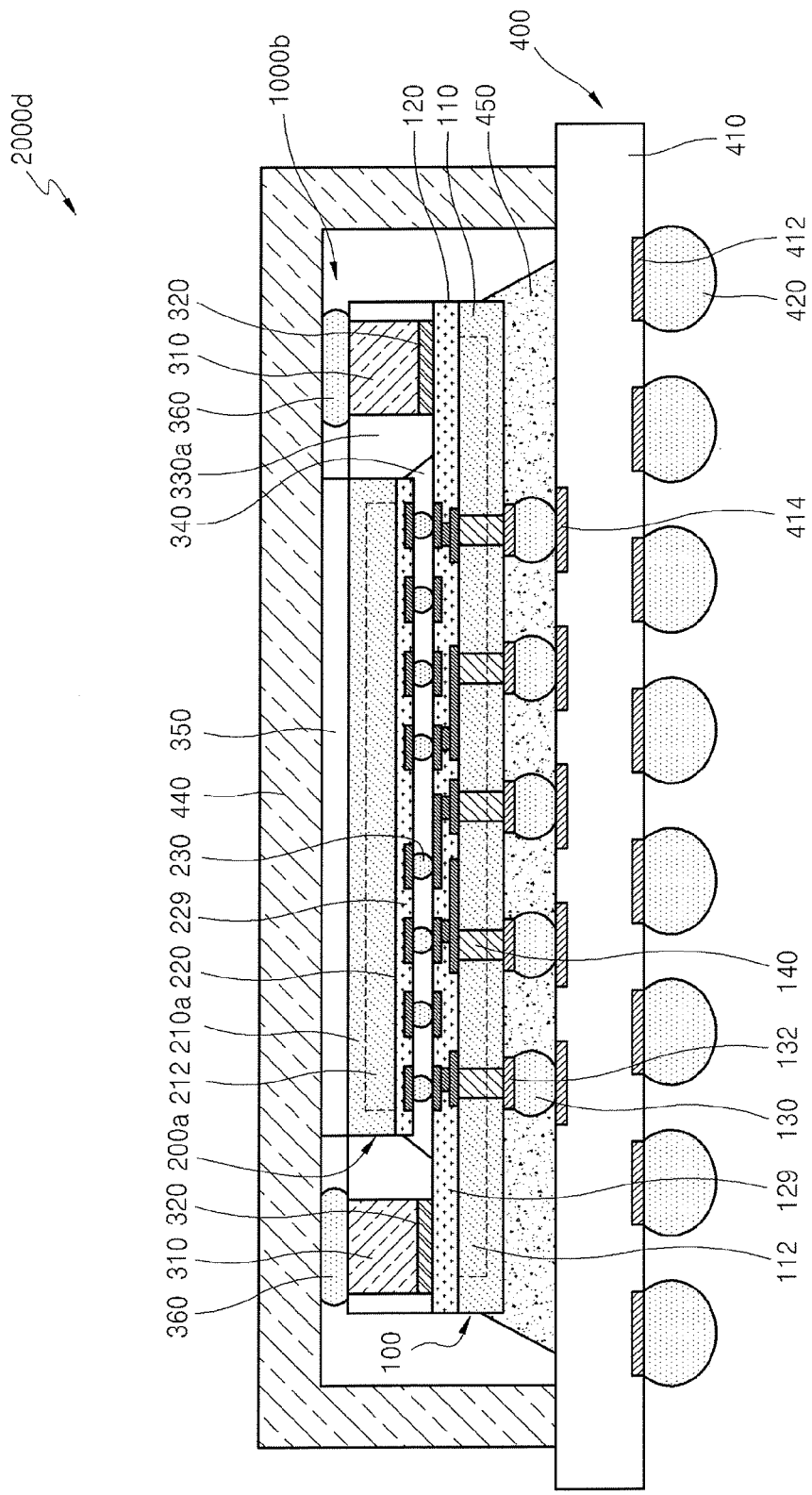
FIG. 9 is a cross-sectional view of a semiconductor package according to another embodiment of the inventive concept.

FIG. 9 is a cross-sectional view of a semiconductor package 2000d according to another embodiment of the inventive concept.

Referring to FIG. 9, the semiconductor package 2000d includes the first substrate 400, the stack package 1000b, and the heat spreader 440. The stack package 1000b includes the first semiconductor chip 100, the second semiconductor chip 200a, the supporter 310, and the internal molding member 330a.

The first substrate 400 has been described above with reference to FIG. 6, the stack package 1000b has been described above with reference to FIG. 3A, and also the heat spreader 440 has been described above with reference to FIG. 8. Thus, detailed descriptions of the first substrate 400, the stack package 1000b, and the heat spreader 440 will be omitted.

The stack package 1000b includes the internal molding member 330a sealing the second semiconductor chip 200a and the supporter 310, as illustrated in FIGS. 9 and 3A. An upper surface of the second semiconductor chip 200a may be disposed at the same layer level as an upper surface of the supporter 310, and the second semiconductor chip 200a may be exposed by the internal molding member 330a. Thus, the stack package 1000b has a smaller thickness than the stack package 1000a of FIG. 1, and thus warpage may be further prevented. In addition, since the second semiconductor chip 200a is exposed, dissipation properties may be improved.

The heat spreader 440 is disposed to surround the stack package 1000b, and the heat spreader 440 may be disposed adjacent to an upper surface of the stack package 1000b, in particular, the upper surface of the second semiconductor chip 200a so that heat may be transmitted between the heat spreader 440 and the stack package 1000b, in particular, the second semiconductor chip 200a. The heat spreader 440 may be fixed onto the supporter 310 by the solder layer 360. In addition, the heat spreader 440 may be fixed to the first substrate 440.

The thermal interface material layer 350 may be disposed or inserted between the heat spreader 440 and the upper surface of the second semiconductor chip 200a. The thermal interface material layer 350 may be used to smoothly dissipate heat generated from the semiconductor layer 210a to the heat spreader 440. The thermal interface material layer 350 may be formed of a thermal interface material (TIM). Examples of the TIM may include a solder, a polymer, a polymer gel, and polymer/solder hybrid. Other examples of the TIM may include a thermal interface sheet, or grease.

The solder layer 360 may be disposed or inserted between the heat spreader 440 and an upper surface of the supporter 310. The solder layer 360 may be replaced by a thermal interface adhesive tape. In addition, the solder layer 360 may be integrated in the thermal interface material layer 350.

The heat spreader 440 of the semiconductor package 2000d is disposed on the stack package 1000b through which the second semiconductor chip 200a is exposed while protecting the stack package 1000b, and thus the heat spreader 440 of the semiconductor package 2000d may improve heat dissipation properties, compared to the semiconductor package 2000d.

The semiconductor package 2000d may be manufactured using a method which will be described hereinafter. However, this method is just an example, and thus the inventive concept is not limited thereto. The stack package 1000b in which solder pads are formed on the supporter 310 may be prepared, and then the stack package 1000b may be installed on the first substrate 400. Then, the heat spreader 440 may be disposed on the stack package 1000b, and then the solder pads are reflowed to modify the solder layer 360, thereby fixing the heat spreader 440 onto the supporter 310. The thermal interface material layer 350 may be formed on the stack package 1000b while the stack package 1000b is prepared. Alternatively, prior to disposing the heat spreader 440 on the stack package 1000b, the thermal interface material layer 350 may be disposed on the stack package 1000b.

Figure 10:
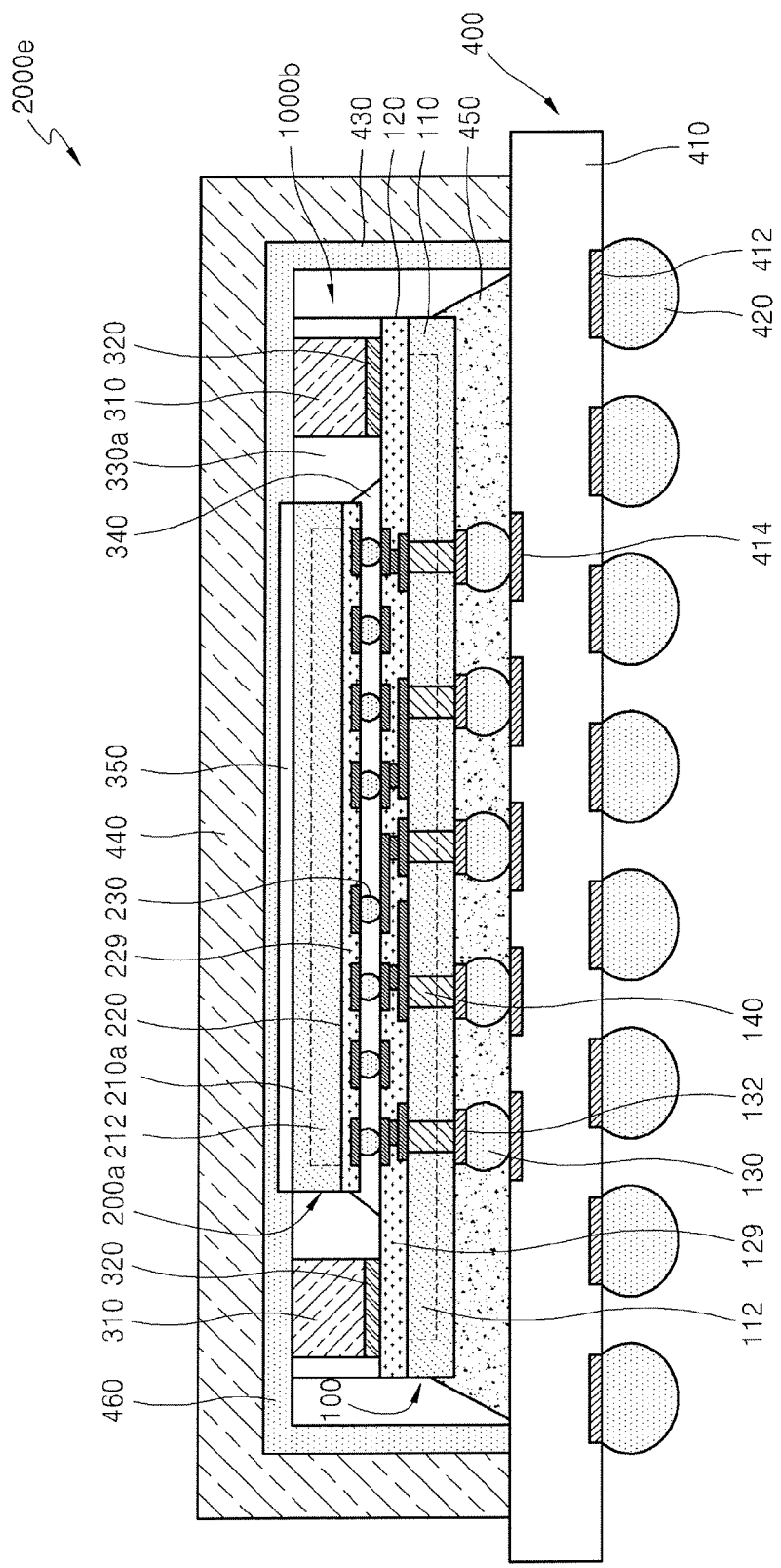
FIG. 10 is a cross-sectional view of a semiconductor package according to another embodiment of the inventive concept.

FIG. 10 is a cross-sectional view of a semiconductor package 2000e according to another embodiment of the inventive concept.

Referring to FIG. 10, the semiconductor package 2000e includes the first substrate 400, the stack package 1000b, and the heat spreader 440. The stack package 1000b includes the first semiconductor chip 100, the second semiconductor chip 200a, the supporter 310, and the internal molding member 330a.

The first substrate 400 has been described with reference to FIG. 6, the stack package 1000b described with reference to FIG. 3A, and the heat spreader 440 described with reference to FIG. 8. Thus, detailed descriptions of the first substrate 400, the stack package 1000b, and the heat spreader 440 will be omitted.

The heat spreader 440 further includes a solder layer 460 that is formed on an entire inner surface of the heat spreader 440. The solder layer 460 may be simultaneously formed with the heat spreader 440. The solder layer 460 may include a solder resist. The solder layer 460 may be formed on the thermal interface material layer 350. The solder layer 460 may be integrated in the thermal interface material layer 350 as a single monolithic layer. In addition, the solder layer 460 may be replaced by an adhesive tape formed of a material having high heat conductivity.

The semiconductor package 2000e may be formed according to a method which will be described hereinafter. However, this method is just an example, and thus the inventive concept is not limited thereto. The stack package 1000b in which the thermal interface material layer 350 is formed may be prepared on the second semiconductor chip 200, and then the stack package 1000b may be installed on the first substrate 400. Then, the heat spreader 440 may be formed on an entire inner surface of the solder layer 460, and then the heat spreader 440 may be disposed on the stack package 1000b so that the solder layer 460 may contact the thermal interface material layer 350. Then, the solder layer 460 may be reflowed so that the heat spreader 440 may be fixed onto the supporter 310 of the stack package 1000b.

By forming the solder layer 460 on the inner surface of the heat spreader 440, a manufacturing process of the semiconductor package 2000e may be simplified.

Figure 11:
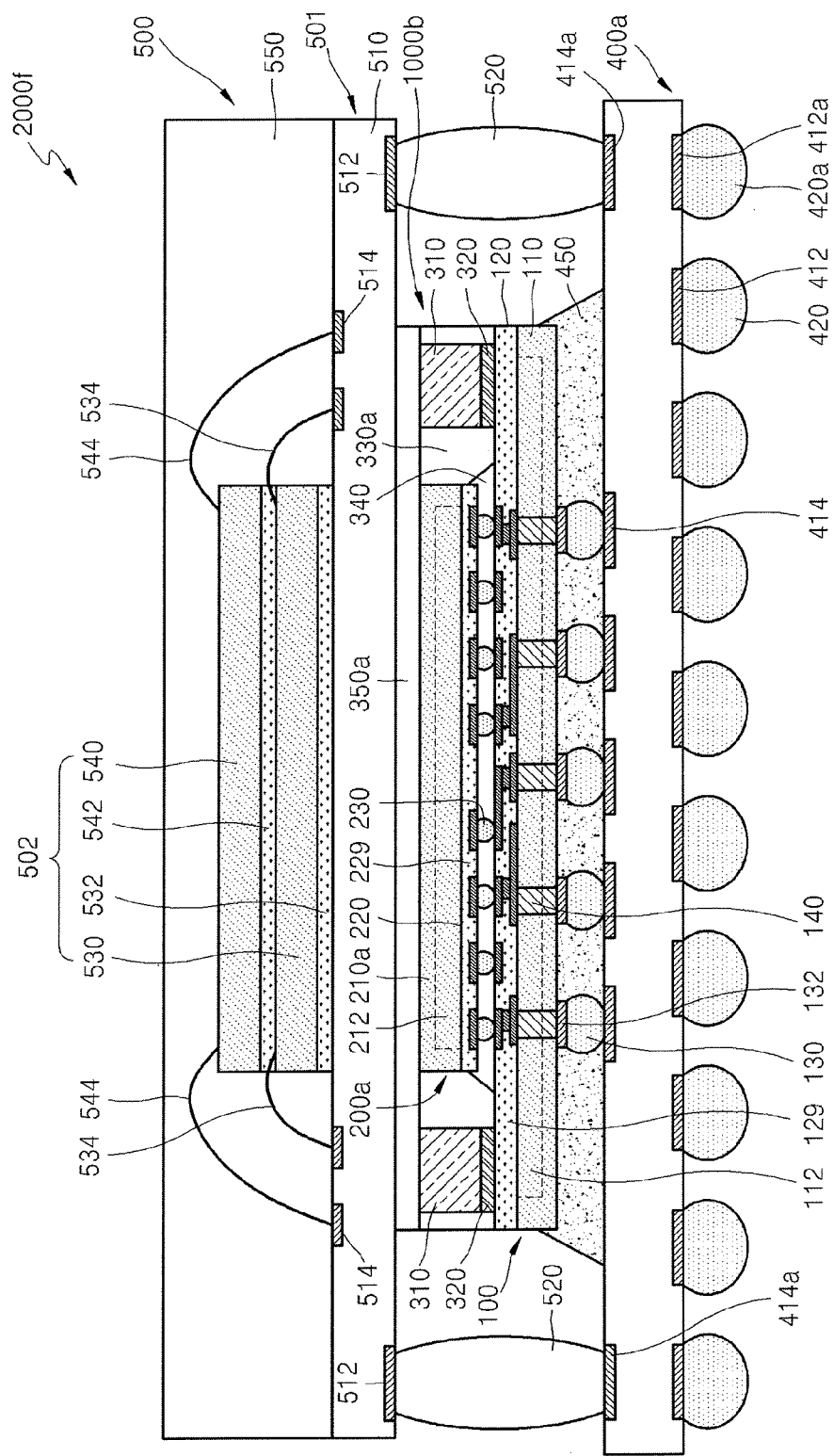
FIG. 11 is a cross-sectional view of a semiconductor package according to another embodiment of the inventive concept.

FIG. 11 is a cross-sectional view of a semiconductor package 2000f according to another embodiment of the inventive concept.

Referring to FIG. 11, the semiconductor package 2000f includes a first substrate 400a, the stack package 1000b, an upper package 500, and a thermal interface material layer 350a. The stack package 1000b includes the first semiconductor chip 100, the second semiconductor chip 200a, the supporter 310, and the internal molding member 330a. The thermal interface material layer 350a is disposed on an exposed upper surface of the second semiconductor chip 200a and an upper surface of the supporter 310 of the stack package 1000b. The upper package 500 includes a second substrate 501 and a third semiconductor chip 502. The second substrate 501 is disposed to contact an upper surface of the thermal interface material layer 350a, and is electrically connected to the first substrate 400a. The third semiconductor chip 502 is installed on the second substrate 501.

The first substrate 400a of FIG. 11 is similar to the first substrate 400 of FIG. 6, and detail descriptions thereof will not be described herein again. In addition, the stack package 1000b has been described with reference to FIG. 3A, and detailed descriptions thereof will not be described herein again.

The first substrate 400a may include package connection pads 414a to which package connection bumps 520 are to be connected. The package connection pads 414a may be formed of the same material as the first substrate pads 414, but their positions may be different. The package connection pads 414a may be connected to the external connection pads 412 or second external connection pads 412a by a wiring pattern (not shown). Second solder balls 420a may be attached to lower surfaces of the second external connection pads 412a, respectively. The second external connection pads 412a and the second solder balls 420a may be formed of the same material as the external connection pads 412 and the solder balls 420, respectively, but their positions may be different. The package connection bumps 520, the package connection pads 414a, the second external connection pads 412a, and the second solder balls 420a may provide a path or terminal to input and output signals to and from the upper package 500.

The thermal interface material layer 350a may be formed on the stack package 1000b. The thermal interface material layer 350a may cover an upper surface of the second semiconductor chip 200a, and an upper surface of the supporter 310. The thermal interface material layer 350a may be materially the same as the thermal interface material layer 350 of FIG. 3B. The thermal interface material layer 350a may include a thermal interface material (TIM).

The second substrate 501 includes a base layer 510, second substrate connection pads 512, bonding pads 514, the second substrate connection pads 512, and a wiring pattern (not shown) for connecting the bonding pads 514 to each other. The second substrate 501 may be a PCB, and the PCB may include a multi-layered structured including a wiring pattern formed therein. The base layer 510 may be formed of the same material as the base layer 410 of FIG. 6, and detailed descriptions thereof will be omitted. The second substrate 501 is similar to the first substrate 400 of FIG. 6, and thus detailed descriptions thereof will also be omitted.

The second substrate connection pads 512 may be disposed on a lower surface of the base layer 510. The second substrate connection pads 512 may be electrically connected to the package connection bumps 520. The second substrate connection pads 512 may be electrically connected to the bonding pads 514 by using the wiring pattern. The bonding pads 514 are connected to bonding wires 534 and 544 that are connected to the third semiconductor chip 502 that is installed on the second substrate 501.

The third semiconductor chip 502 may include a plurality of semiconductor chips that are stacked to each other, as shown in FIG. 11. Two semiconductor chips are stacked in FIG. 11, which is just an example, and thus the number of semiconductor chips may be changed, if necessary.

The third semiconductor chip 502 may include a lower semiconductor chip 530, and the upper semiconductor chip 540. The lower semiconductor chip 530 and an upper semiconductor chip 540 may each include circuit devices including a memory device such as a volatile memory device, or a non-volatile memory device.

The third semiconductor chip 502 may include an adhesive layer 532 to attach the lower semiconductor chip 530 onto the second substrate 501, and an adhesive layer 542 to attach the upper semiconductor chip 540 onto the lower semiconductor chip 530. The lower semiconductor chip 530 and the upper semiconductor chip 540 may be connected to the bonding pads 514 of the second substrate 501 by using the bonding wires 534 and 544, respectively. In FIG. 11, the third semiconductor chip 502 is installed on the second substrate 501 by using a method using the bonding wires 534 and 544, which is just an example. Thus, like in the stack package 1000b, the third semiconductor chip 502 may be installed on the second substrate 501 by using a flip-chip bonding method.

The upper package 500 may include a molding member 550 to protect the third semiconductor chip 502, and the bonding wires 534 and 544. For example, the molding member 550 may include an EMC including an epoxy resin and a thermosetting resin.

The semiconductor package 2000f may be embodied in a package-on-package (PoP) or system-in-package (SIP) in which the upper package 500 is stacked on the stack package 1000b, and thus, a highly integrated semiconductor package may be provided.

Figure 12:
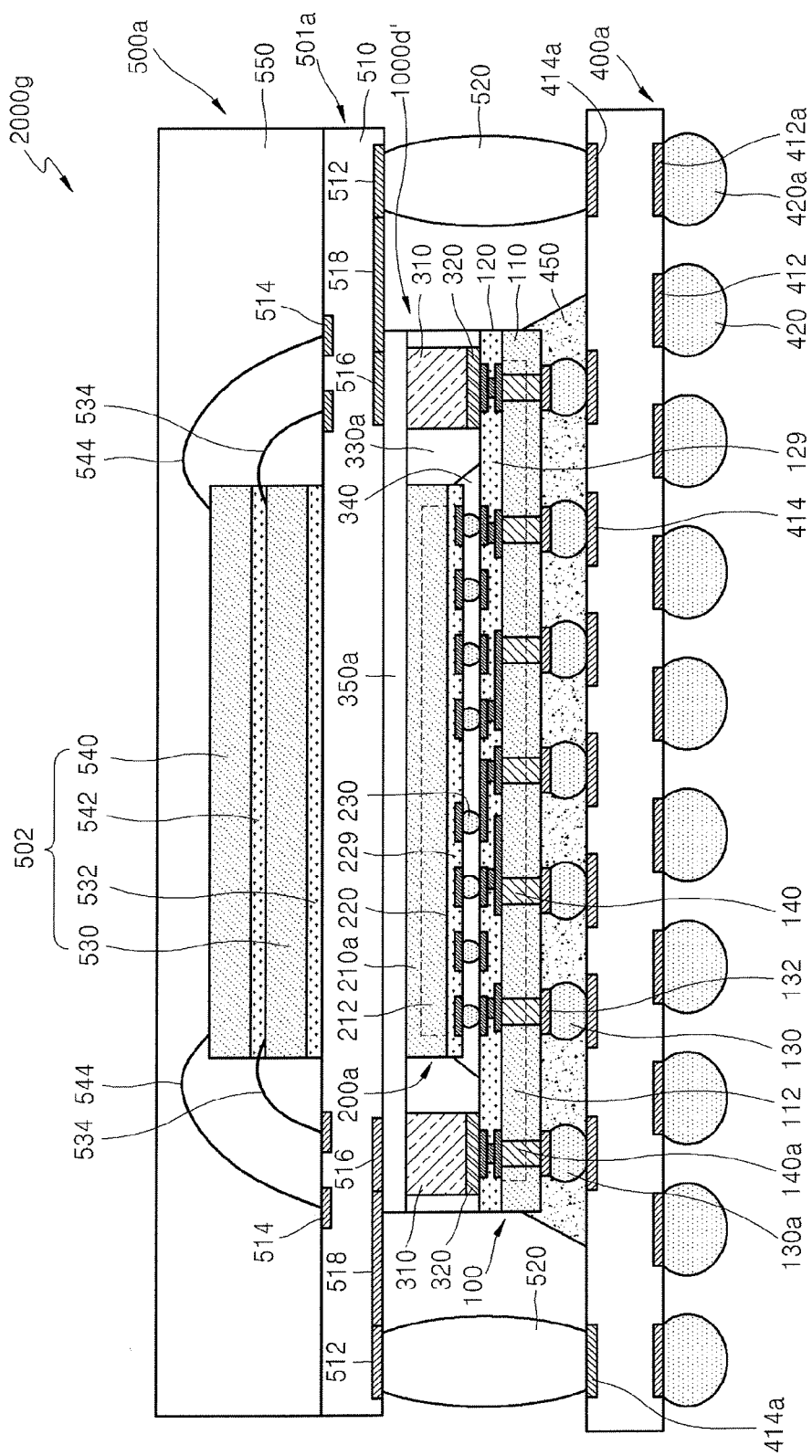
FIG. 12 is a cross-sectional view of a semiconductor package according to another embodiment of the inventive concept.

FIG. 12 is a cross-sectional view of a semiconductor package 2000g according to another embodiment of the inventive concept.

Referring to FIG. 12, the semiconductor package 2000g includes the first substrate 400a, a stack package 1000d', an upper package 500a, and the thermal interface material layer 350a. The semiconductor package 2000g of FIG. 12 is similar to the semiconductor package 2000f of FIG. 11, and will not be described herein again.

The stack package 1000d' is formed by combining the features of the stack package 1000b of FIG. 3A and the stack package 1000d of FIG. 4. The stack package 1000d' includes the heat dissipation TSVs 140a. The heat dissipation TSVs 140a provide a path for dissipating heat generated from the circuit devices 112 of the first semiconductor chip 100 outwards.

The heat dissipation TSVs 140a may be connected to the supporter 310 so that heat may be transmitted between the heat dissipation TSVs 140a and the supporter 310. In addition, the heat dissipation TSVs 140a may be connected to the heat dissipation connection bumps 130a so that heat may be transmitted between the heat dissipation TSVs 140a and the heat dissipation connection bumps 130a. Heat generated from the first semiconductor chip 100 may be transmitted to the supporter 310 and heat dissipation connection bumps 130a.

The heat dissipation connection bumps 130a may be disposed on the first substrate pads 414, and the first substrate pads 414 may be connected to the second external connection pads 412a and the second solder balls 420a through a wiring pattern (not shown).

Second substrate heat dissipation pads 516 may be disposed on the supporter 310. The supporter 310 and the second substrate heat dissipation pads 516 may be connected to each other by the thermal interface material layer 350 interposed therebetween so that heat may be transmitted between the supporter 310 and the second substrate heat dissipation pads 516. The second substrate heat dissipation pads 516 may be connected to the second substrate connection pads 512 through wiring patterns 518. As described above, the second substrate connection pads 512 may be connected to the package connection pads 414a through the package connection bumps 520. In addition, the package connection pads 414a may be connected to the second external connection pads 412a and the second solder balls 420a through a wiring pattern (not shown).

A ground voltage (VSS) or a power voltage (VDD) may be applied from an external source through the second solder balls 420a to the circuit devices 112, and may also be provided to the circuit devices 212 of the second semiconductor chip 200 through the wiring patterns 128 and the micro connection bumps 230. In addition, the applied voltages VSS or VDD may be provided to the lower semiconductor chip 530 and the upper semiconductor chip 540 through the package connection bumps 520.

Thus, two paths may be obtained (provided) to dissipate heat generated from the first semiconductor chip 100 to the second solder balls 420a. One of the two paths is a path provided through the heat dissipation TSVs 140a, and the other one is a path provided using the second substrate heat dissipation pads 516. Accordingly, heat generated from the semiconductor package 2000g may be efficiently dissipated outwards.

FIGS. 13A through 13G are cross-sectional views showing a method of manufacturing a stack package, according to an embodiment of the inventive concept.

The method to be described with reference to FIGS. 13A through 13G is just an example, and thus the inventive concept is not limited thereto. For a clear understanding, FIGS. 13B through 13G show two stack packages. The method to be described with reference to FIGS. 13A through 13G is a method of manufacturing a stack package 1000b' formed by modifying the stack package 1000b of FIG. 3A, and may be applied to manufacture other stack packages according to other embodiments of the inventive concept. Components that have been described with reference to FIG. 3A will be described herein again.

Figure 13A:
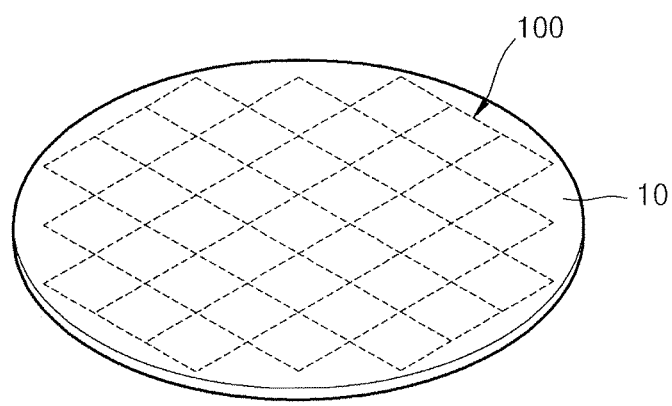
FIGS. 13A through 13G are cross-sectional views of a method of manufacturing a stack package, according to an embodiment of the inventive concept.

Referring to FIG. 13A, a semiconductor wafer 10 on which first semiconductor chips 100 are arranged is provided.

Each first semiconductor chip 100 includes the TSVs 140, as shown in FIG. 1. For example, the semiconductor wafer 10 may include a group IV compound, or group III-V compounds such as Si, Ge, or GaAs. The semiconductor wafer 10 may have a thickness of 100 µm or less by polishing a rear surface thereof to a predetermined thickness.

Figure 13B:
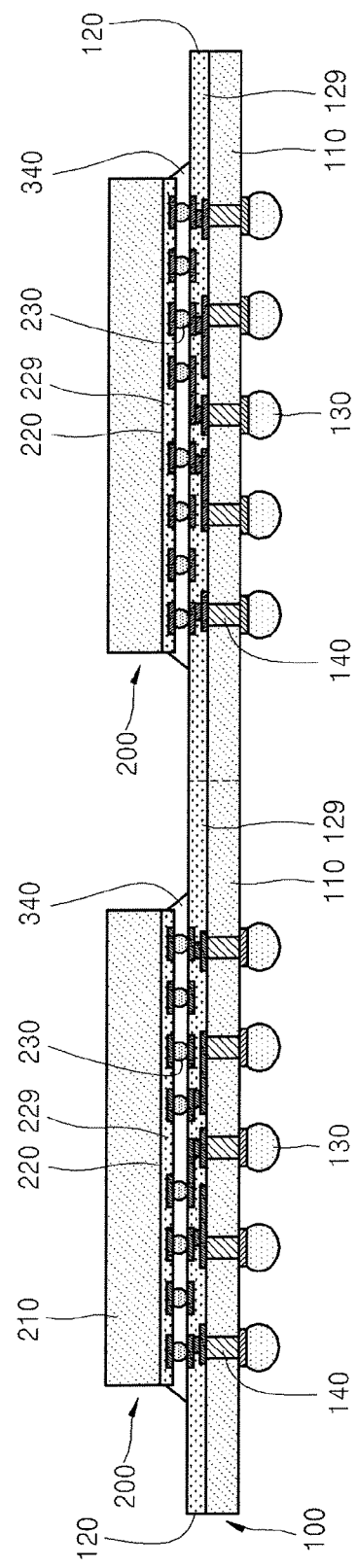

Referring to FIG. 13B, second semiconductor chips 200 are stacked on the first semiconductor chips 100.

Each second semiconductor chip 200 may be connected to the TSVs 140 of the first semiconductor chip 100 through the micro connection bumps 230. In order to fix the second semiconductor chip 200 onto the first semiconductor chip 100, the underfill layer 450 may be inserted or disposed between the second semiconductor chip 200 and the first semiconductor chip 100.

Figure 13C:
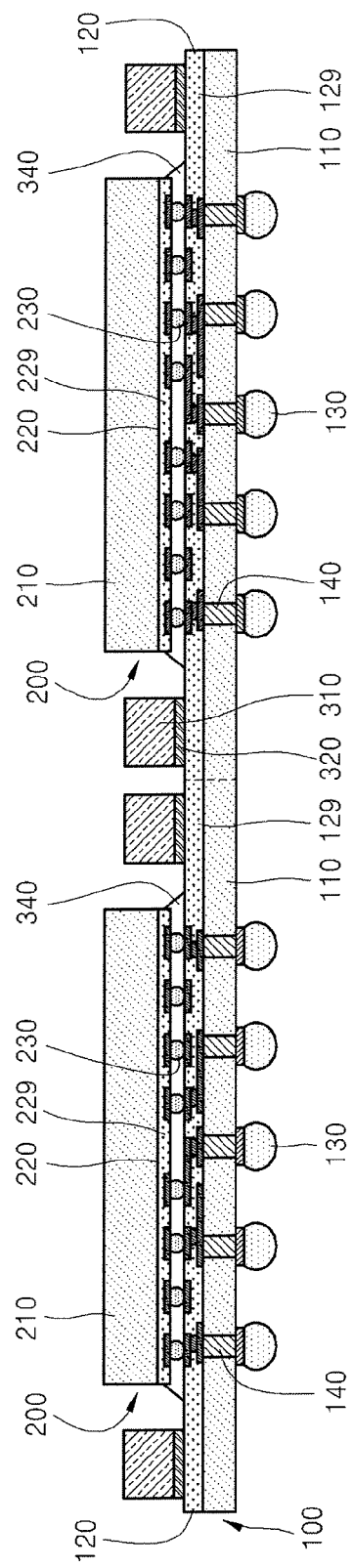

Referring to FIG. 13C, the supporter 310 is attached onto the first semiconductor chip 100 so as to be spaced apart from an edge (side surface or lateral surface) of the second semiconductor chip 200.

The supporter 310 may have a thickness thinner than the second semiconductor chip 200.

When the supporter 310 is formed of an epoxy-based material, the supporter 310 is injected into the first semiconductor chip 100 by using a syringe without using the adhesive layer 320, thereby obtaining a structure as shown in FIG. 13.

When the supporter 310 is formed of a metal-based material, the supporter 310 may be formed on the first semiconductor chip 100 by using the adhesive layer 320. The supporter 310 may be attached onto the first semiconductor chip 100 by using a conductive adhesive tape. The conductive adhesive tape may be prepared by forming a metal sheet and a thermal interface adhesive sheet on a base film and then pattering the thermal interface adhesive sheet and the metal sheet to correspond to a shape of the supporter 310. Then, the conductive adhesive tape may be attached on the semiconductor chip 100 so that the thermal interface adhesive sheet may contact the first semiconductor chip 100. Then, the base film may be removed to form the supporter 310. The patterned metal sheet may correspond to the supporter 310, and the thermal interface adhesive sheet may correspond to the adhesive layer 320.

Figure 13D:
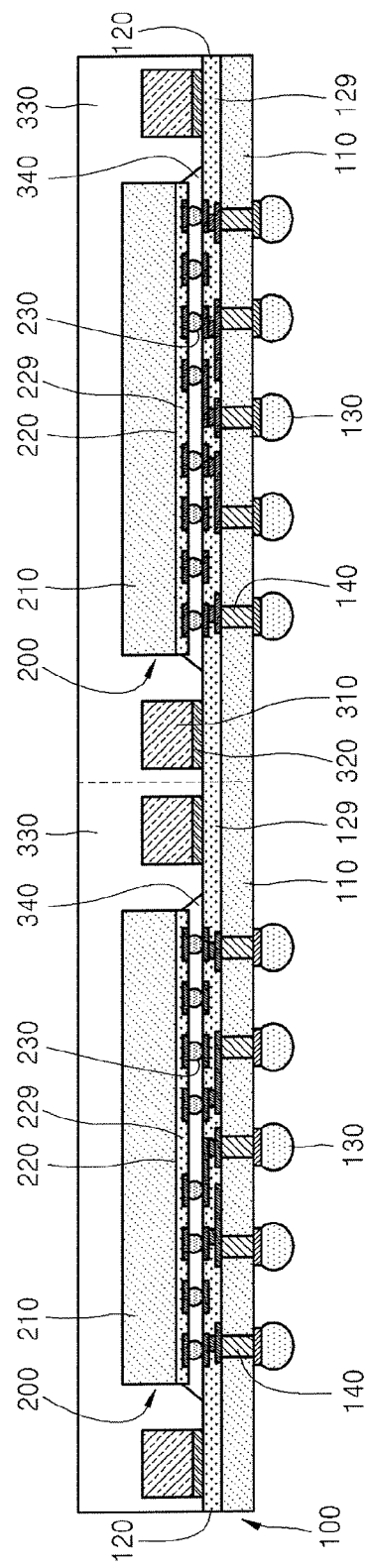

Referring to FIG. 13D, the molding member 330 is molded on an entire surface of the semiconductor wafer 10 (see FIG. 13A) to cover the second semiconductor chip 200 and the supporter 310.

The molding member 330 may include, for example, an epoxy resin, a silicon resin, or a polyimide resin, and may have a Young's modulus of about 1 GPa.

Figure 13E:
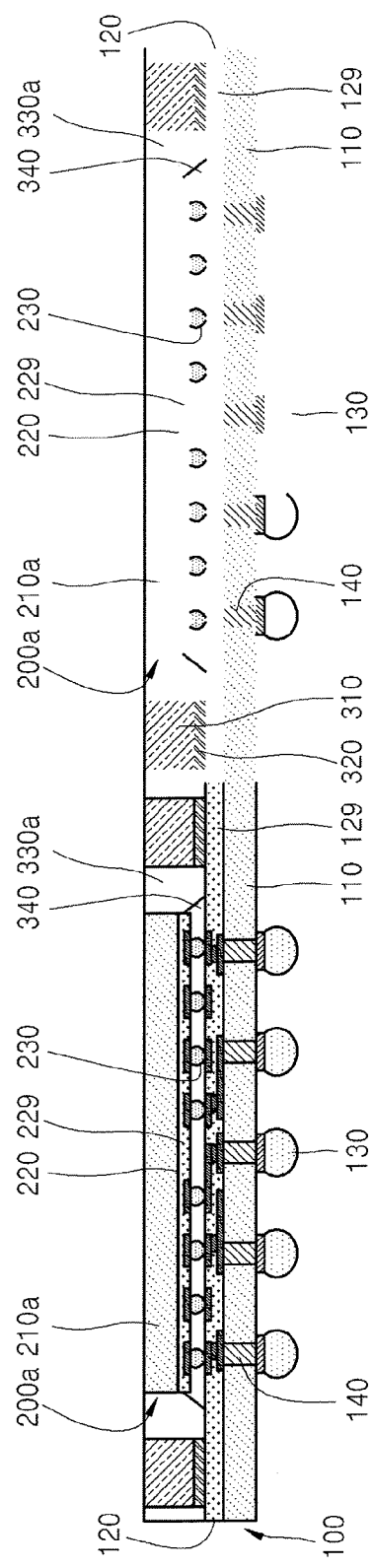

Referring to FIG. 13E, the second semiconductor chip 200a and the molding member 330a each have a thickness thinner than the semiconductor chip 100, and an upper surface of the supporter 310 is exposed.

An upper portion of the second semiconductor chip 200 and an upper portion of the molding member 330 may be removed by using a grinding method. The stack package according to the present embodiment may be thinned, and the upper portion of the second semiconductor chip 200 is exposed out of the stack package, thereby improving heat dissipation properties.

Figure 13F:
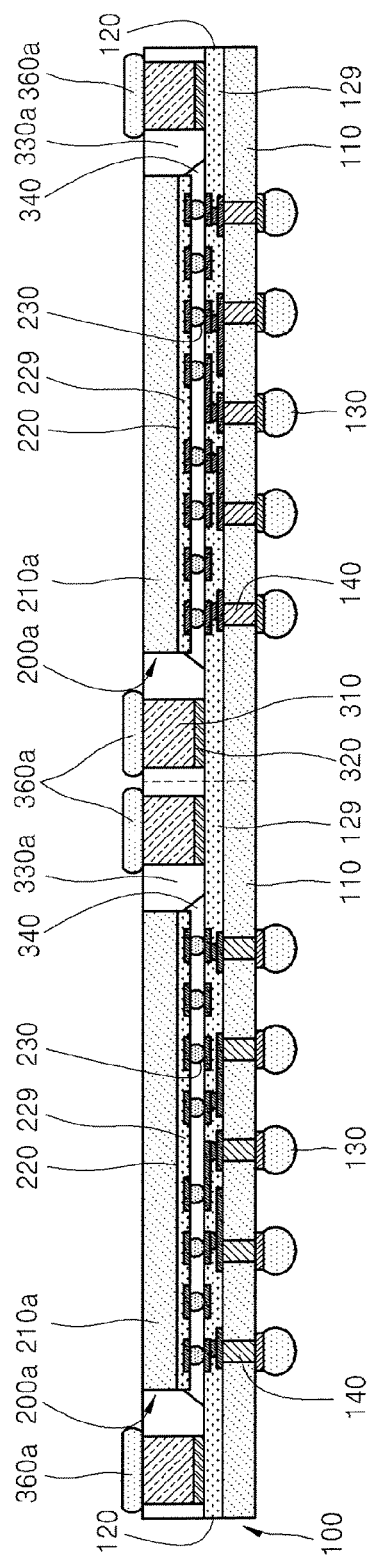

Referring to FIG. 13F, solder pads 360a are formed on the supporter 310.

The solder pads 360a may be provided to attach a heat spreader onto the supporter 310. The solder pads 360a may be formed by using a ball drop method or a paste printing method. The solder pads 360a are not necessary, and thus an operation illustrated in FIG. 13F may be omitted, if necessary.

Figure 13G:
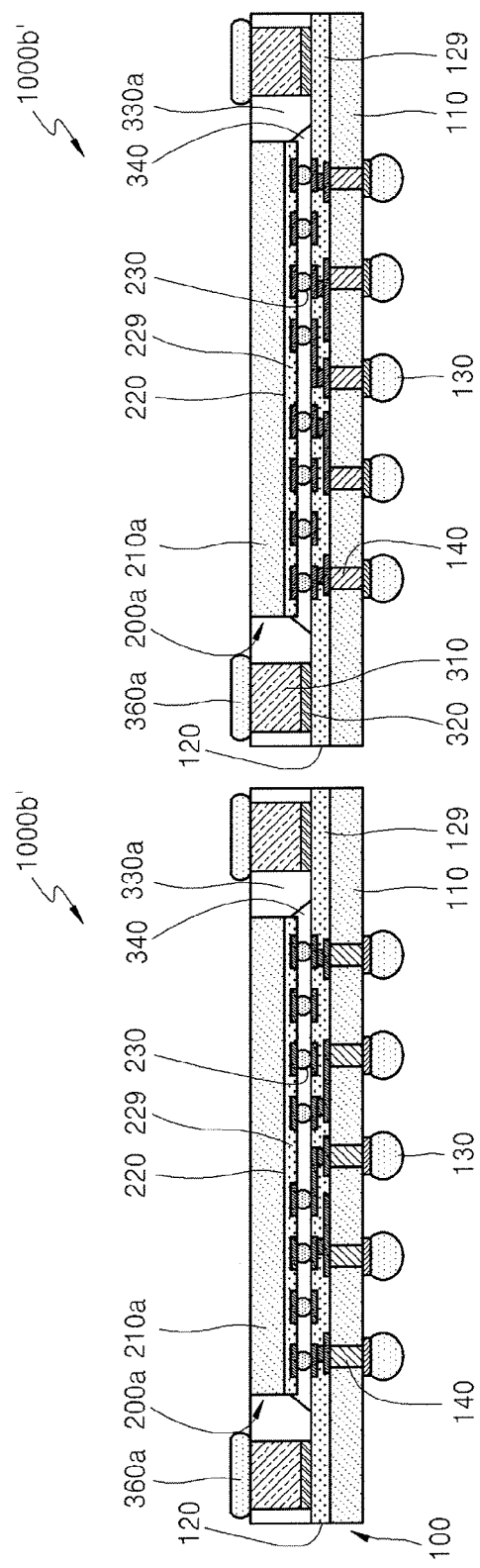

Referring to FIG. 13G, the semiconductor wafer 10 may be cut along a scribe line of FIG. 13F to obtain each stack package 1000b'.

The semiconductor wafer 10 may be cut by using a blade, a water jet, a laser, etc.

The stack package 1000b' manufactured as described above may be used to manufacture various kinds of final semiconductor packages, if necessary.

According to an embodiment of the present general inventive concept, the packages illustrated in FIGS. 1 through 13G may be used in an electronic apparatus having a functional unit to perform at least one function of the electronic apparatus according to an operation of at least one of the packages. The package may store data or a program therein and the stored data or program can be used to operate the functional unit of the electronic apparatus. Also the package may receive and store data generated from the functional unit. The package may be used to generate, modify, or store the data and program corresponding to an operation of the electronic apparatus. The package of the electronic apparatus may be a three-dimensional (3D) system-in-package (SIP). The electronic apparatus may include the package as the three-dimensional (3D) system-in-package, a control unit having one or more terminals connected to the package through the solder bolls thereof to process data to be stored in the package or process date read from the package, an interface connected between the control unit and an external device to communicate with each other to transmit and receive data using a wired or wireless communication line. If one of the first semiconductor and the second semiconductor of the package processes data read from the other one of the first semiconductor and the second semiconductor chip, the control unit receives the data which has been processed by the package. The package, the control unit, and the interface may be disposed in a housing of the electronic apparatus. It is possible that at least one of the package, the control unit, and the interface may be disposed in an outside of the housing of the electronic apparatus to be connected to others of the package, the control unit, and the interface through a communication line. Since the electronic apparatus are well-known and the detail descriptions of the package useable with the electronic apparatus have been described above, detailed descriptions thereof are omitted.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A stack package comprising:
   a first semiconductor chip comprising a through silicon via (TSV);
   a second semiconductor chip that is stacked on a first surface of the first semiconductor chip and is electrically connected to the first semiconductor chip through the TSV of the first semiconductor chip;
   a supporter that is attached onto the first surface of the first semiconductor chip so as to be spaced apart from an edge of the second semiconductor chip; and
   a molding member that covers an upper surface of the first semiconductor chip so as to seal the second semiconductor chip and the supporter,
   wherein the supporter comprises a material having a Young's modulus greater than a Young's modulus of the molding member and smaller than a Young's modulus of the first semiconductor chip.

2. The stack package of claim 1, wherein the supporter has a ring shape surrounding the edge of the second semiconductor chip.

3. The stack package of claim 1, wherein the supporter comprises a bar-shaped portion that extends along at least a portion of a lateral surface of the second semiconductor chip.

4. The stack package of claim 1, wherein the supporter comprises a corner reinforcing portion that is bent so as to correspond to a corner of the second semiconductor chip.
Zone Name: OCRZone 5. The stack package of claim 1, wherein an upper surface of the second semiconductor chip and an upper surface of the supporter are disposed at the same layer level, and
   wherein the molding member exposes the upper surface of the second semiconductor chip and the upper surface of the supporter.

6. The stack package of claim 5, further comprising:
   a thermal interface material layer disposed on the upper surface of the second semiconductor layer; and
   a head spreader disposed on the thermal interface material layer.

7. The stack package of claim 6, further comprising a solder layer that is interposed between the supporter and the heat spreader so as to fix the supporter and the heat spreader to each other.

8. The stack package of claim 1, wherein the first semiconductor chip comprises a heat dissipation through silicon via (TSV) that is connected to the supporter so that heat is transferred between the supporter and the heat dissipation TSV.

9. The stack package of claim 1, wherein the second semiconductor chip comprises a plurality of semiconductor chips stacked on each other.

10. A semiconductor package comprising:
a first substrate;
a first semiconductor chip installed on the first substrate and comprising a through silicon via (TSV);
a second semiconductor chip that is stacked on a first surface of the first semiconductor chip and is electrically connected to the first semiconductor chip through the TSV of the first semiconductor chip;
a supporter that is attached onto the first surface of the first semiconductor chip to be spaced apart from an edge of the second semiconductor chip; and
an internal molding member that covers an upper surface of the first semiconductor chip to seal the second semiconductor chip and the supporter,
wherein the supporter comprises a material having a Young's modulus greater than a Young's modulus of the internal molding member and smaller than a Young's modulus of the first semiconductor chip.

11. A stack package comprising:
a first semiconductor chip;
a second semiconductor chip disposed on a first area of a first surface of the first semiconductor chip and electrically connected to the first semiconductor chip;
a supporter disposed on a second area of the first surface of the first semiconductor chip to protect the first semiconductor chip; and
a molding member that covers an upper surface of the first semiconductor chip so as to seal the second semiconductor chip and the supporter,
wherein the supporter comprises a material having a Young's modulus greater than a Young's modulus of the molding member and smaller than a Young's modulus of the first semiconductor chip.

12. The stack package of claim 11, wherein the first area is spaced apart from the second area by a distance shorter than a height or a width of the supporter.

13. The stack package of claim 11, wherein the second semiconductor comprises a memory unit to store and read data, and the first semiconductor comprises a circuit device to process the read data and the data to be stored in the memory unit.

14. The stack package of claim 11, wherein the first semiconductor chip comprises a through silicon via (TSV) formed therein to provide an electrical communication between a first side on which the second semiconductor chip is disposed and a second side on which a bump is formed to provide another communication between an external device and at least one of the first semiconductor chip and the second semiconductor chip through the TSV.

15. The stack package of claim 11, wherein the first semiconductor chip comprises:
a first through silicon via (TSV) formed in the first area and formed of an conductive material to electrically connect the first semiconductor chip and the second semiconductor chip; and
a second through silicon via (TSV) formed in the second area and formed of a heat dissipating material to thermally connect the supporter and an outside thereof.

16. The stack package of claim 11, further comprising:
the molding member to cover at least a portion of the supporter, the first semiconductor chip, and the second semiconductor chip,
wherein the supporter is spaced apart from a lateral surface of the second semiconductor chip by a first distance, spaced apart from an external surface of the molding member by a second distance, and has a width wider than at least one of the first distance and the second distance.

17. The stack package of claim 11, wherein the supporter has a height from the first semiconductor chip to correspond to a height of the second semiconductor chip from the first semiconductor chip.

* * * * *